United States Patent
Kim et al.

(10) Patent No.: US 10,248,260 B2
(45) Date of Patent: Apr. 2, 2019

(54) PRESSURE SENSING UNIT AND TOUCH INPUT DEVICE INCLUDING THE SAME

(71) Applicant: HiDeep Inc., Gyeonggi-do (KR)

(72) Inventors: Seyeob Kim, Gyeonggi-do (KR); Bonkee Kim, Gyeonggi-do (KR); Bong Jin Seo, Gyeonggi-do (KR)

(73) Assignee: HIDEEP INC. (KR)

( * ) Notice: Subject to any disclaimer, the term of this patent is extended or adjusted under 35 U.S.C. 154(b) by 0 days.

(21) Appl. No.: 15/663,920

(22) Filed: Jul. 31, 2017

(65) Prior Publication Data

US 2018/0143737 A1 May 24, 2018

(30) Foreign Application Priority Data

Nov. 22, 2016 (KR) .................. 10-2016-0155876

(51) Int. Cl.
| | |
|---|---|
| *G06F 3/041* | (2006.01) |
| *G01L 1/26* | (2006.01) |
| *G06F 3/044* | (2006.01) |
| *G02F 1/1333* | (2006.01) |
| *H01L 27/32* | (2006.01) |

(52) U.S. Cl.
CPC .............. *G06F 3/0418* (2013.01); *G01L 1/26* (2013.01); *G06F 3/044* (2013.01); *G06F 3/0412* (2013.01); *G02F 1/13338* (2013.01); *G06F 2203/04105* (2013.01); *H01L 27/323* (2013.01)

(58) Field of Classification Search
CPC combination set(s) only.
See application file for complete search history.

(56) References Cited

U.S. PATENT DOCUMENTS

| | | | | |
|---|---|---|---|---|
| 2011/0007030 A1* | 1/2011 | Mo | ......................... | G06F 3/044 345/174 |
| 2011/0260998 A1* | 10/2011 | Ludwig | ................. | G06F 3/0414 345/173 |
| 2015/0309625 A1* | 10/2015 | Huang | .................. | G06F 3/0418 345/174 |
| 2016/0162093 A1* | 6/2016 | Kim | ........................ | G06F 3/044 345/174 |
| 2017/0185202 A1* | 6/2017 | Qu | ......................... | G06F 3/0412 |
| 2017/0220174 A1 | 8/2017 | Kim et al. | | |
| 2017/0269756 A1* | 9/2017 | Wang | .................... | G06F 3/0414 |

FOREIGN PATENT DOCUMENTS

| | | |
|---|---|---|
| CN | 105260058 | 1/2016 |
| EP | 3106971 | 12/2016 |

OTHER PUBLICATIONS

EP Search Report for Corresponding Application No. 17190148.1 dated Mar. 12, 2018. EP.

* cited by examiner

*Primary Examiner* — Robin J Mishler
(74) *Attorney, Agent, or Firm* — The Belles Group, P.C.

(57) ABSTRACT

A touch input device capable of detecting a touch pressure may be provided, that includes: a display panel; and a pressure sensing unit which is disposed under the display panel. The pressure sensing unit includes one central pressure sensor for detecting the pressure and a plurality of non-central pressure sensors for detecting the pressure. An area of each of the non-central pressure sensors is less than that of the central pressure sensor.

24 Claims, 18 Drawing Sheets

[Fig. 1a]
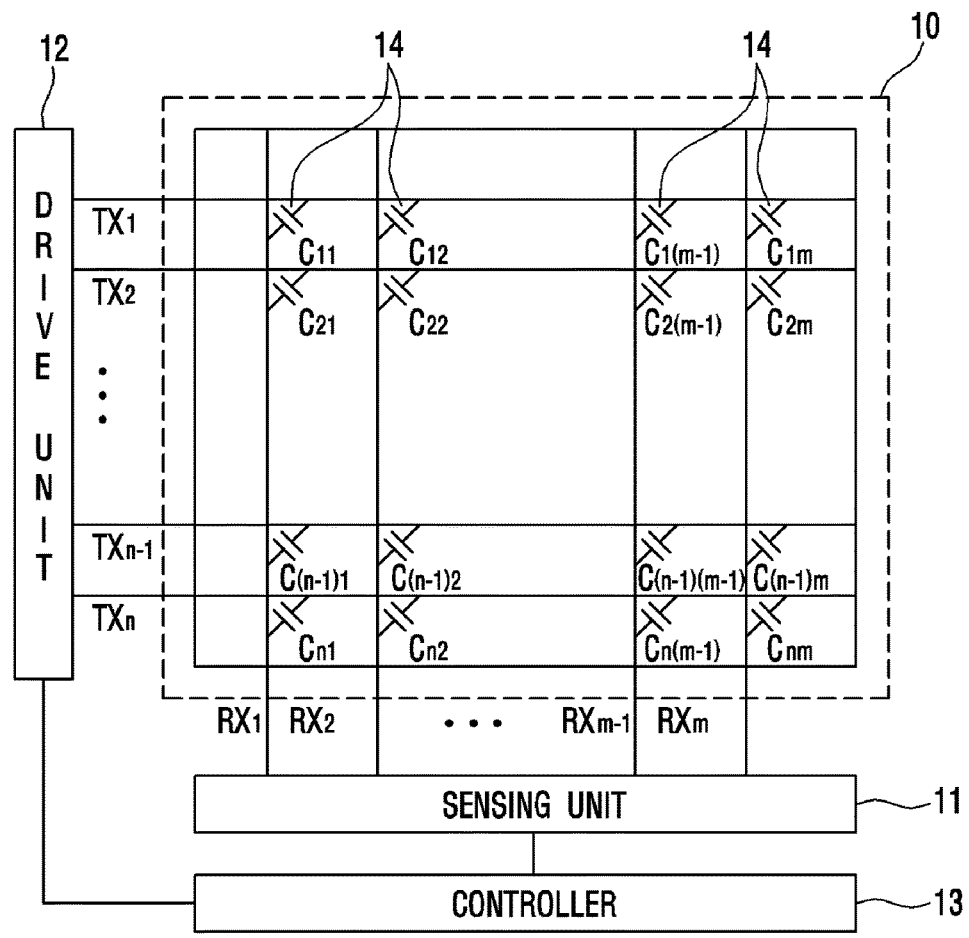

[Fig. 1b]
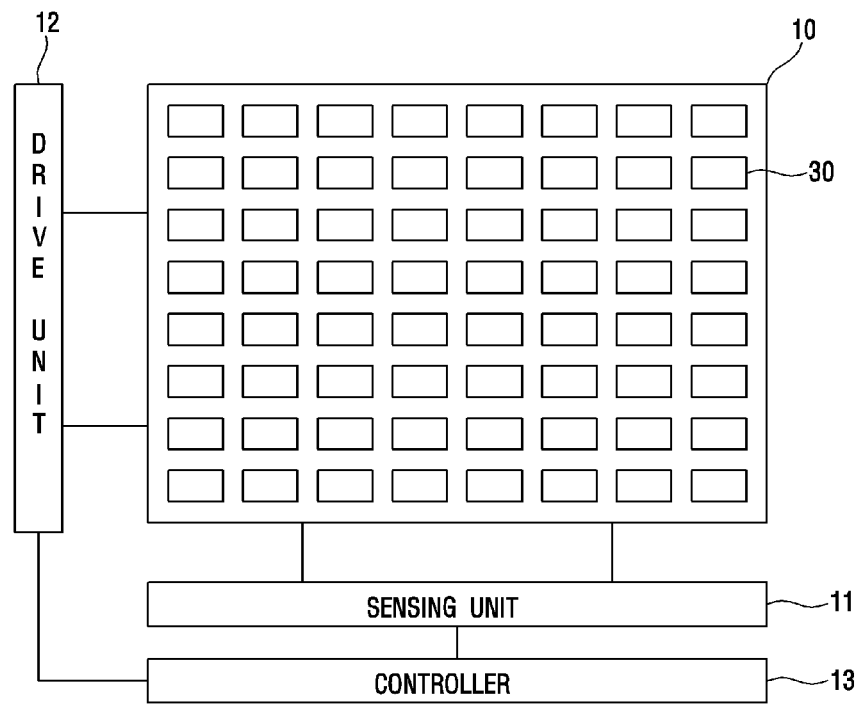
[Fig. 2]
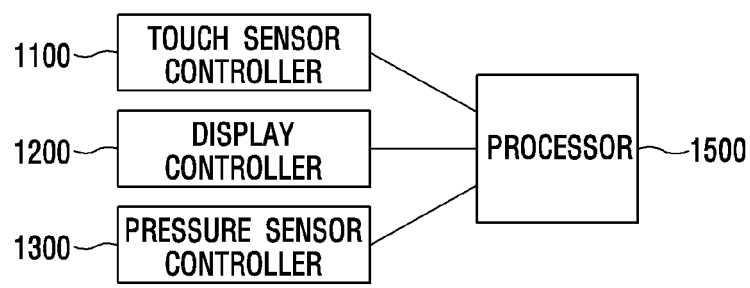

[Fig. 3a]
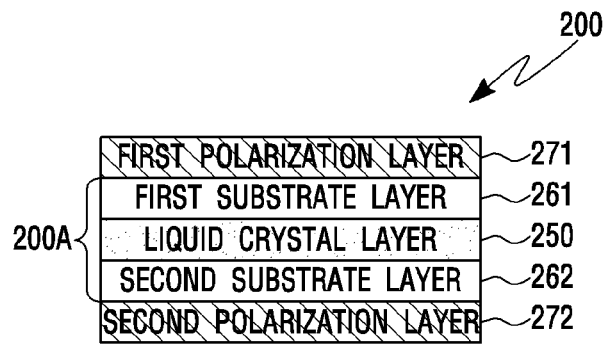
[Fig. 3b]
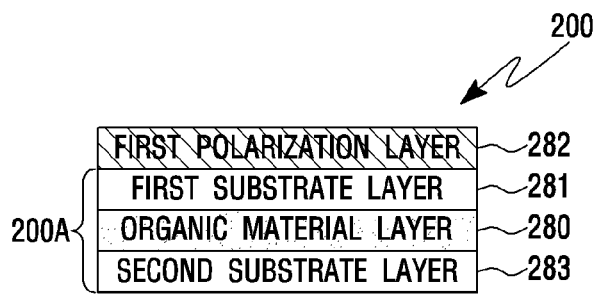
[Fig. 4a]
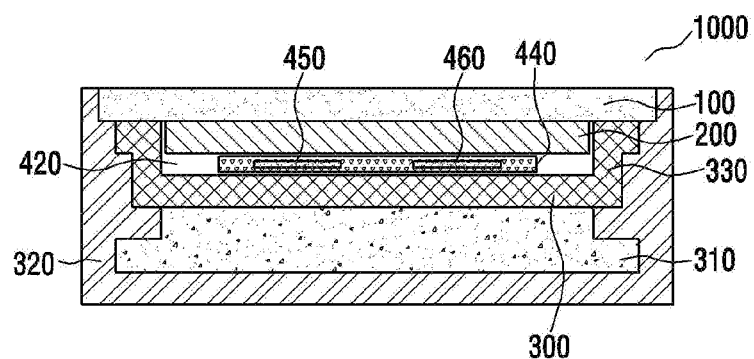

【Fig. 4b】
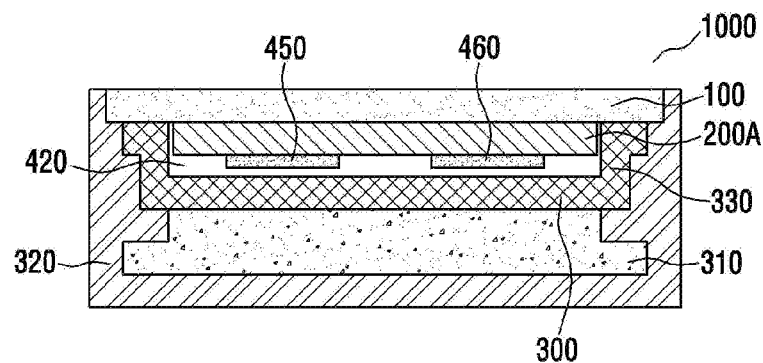
【Fig. 4c】
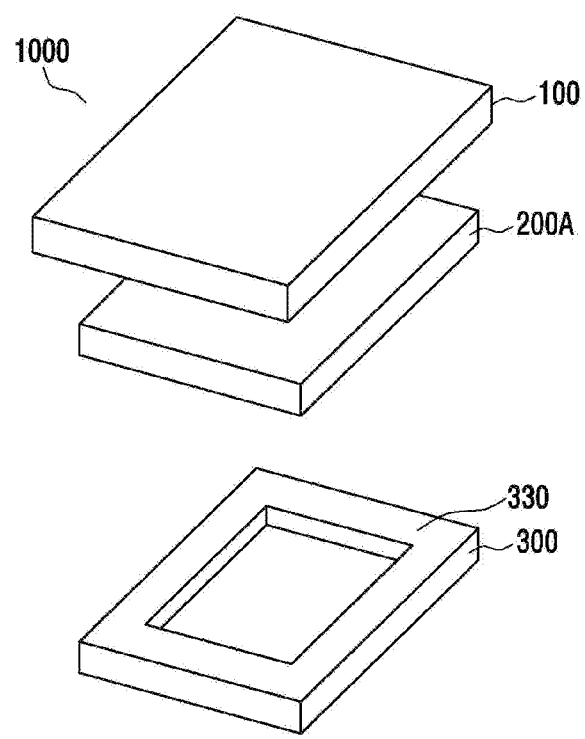

[Fig. 4d]
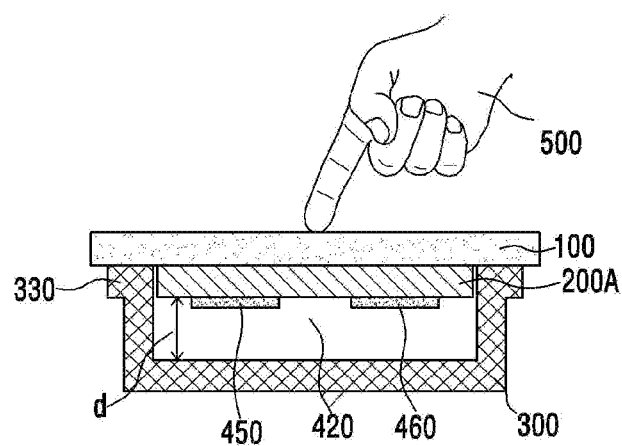
[Fig. 4e]
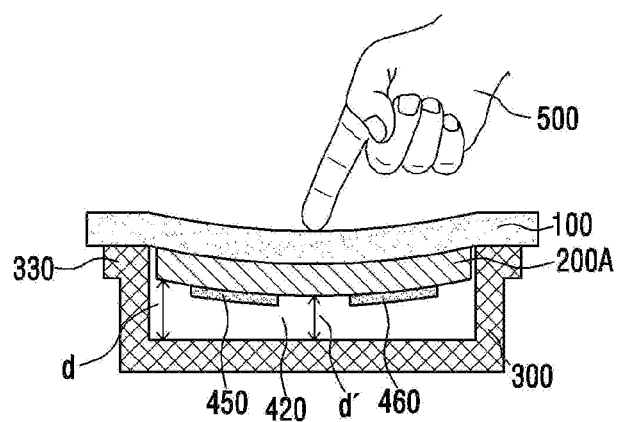

[Fig. 4f]
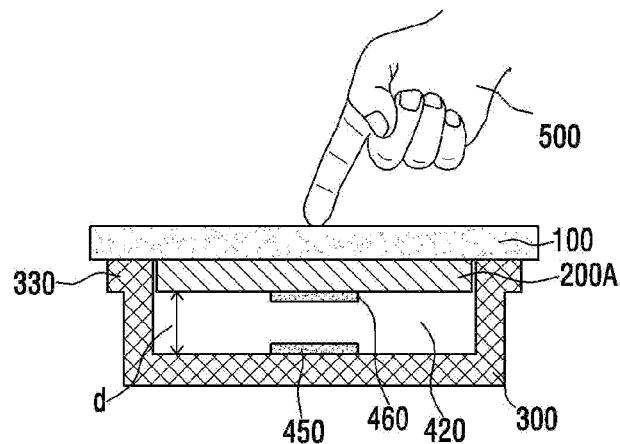
[Fig. 4g]
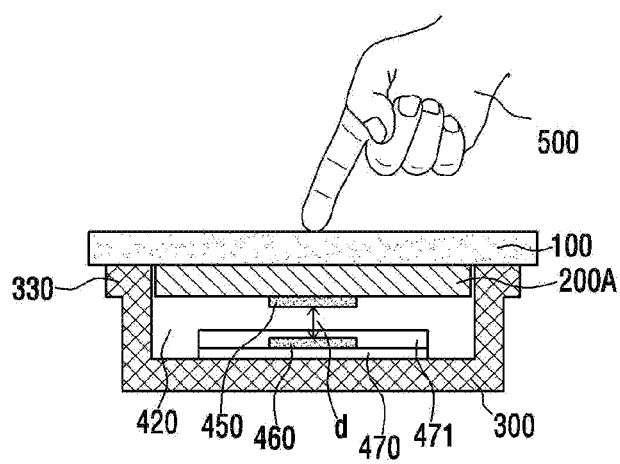

[Fig. 5]
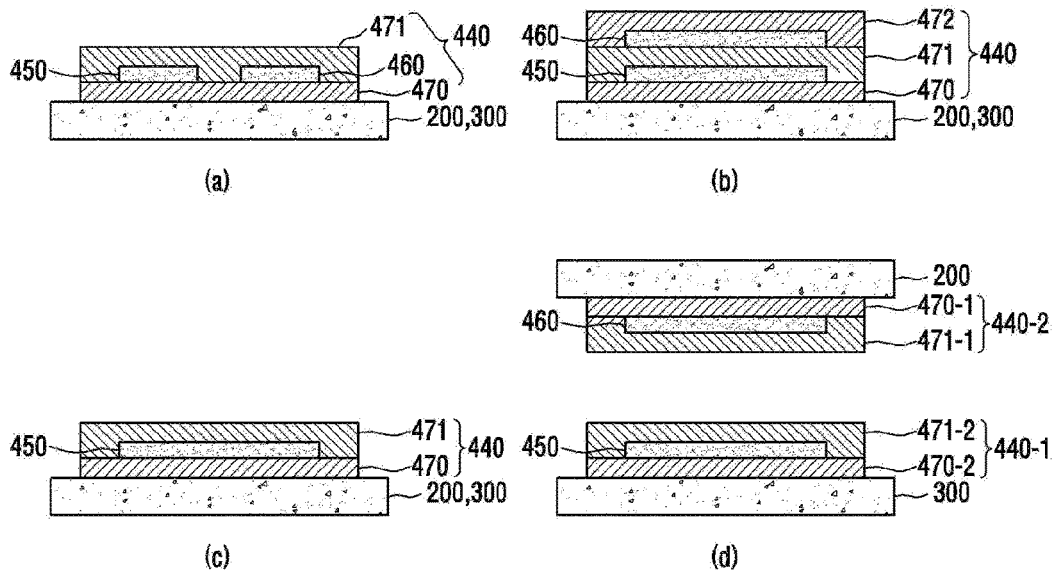
[Fig. 6a]
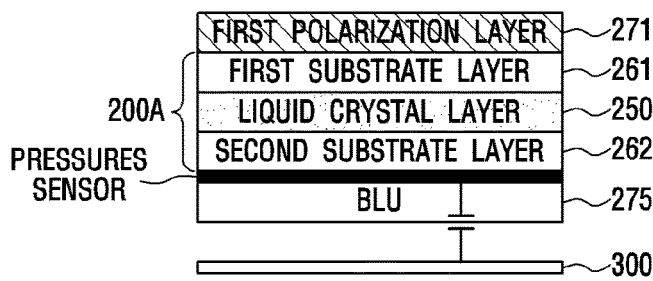
[Fig. 6b]
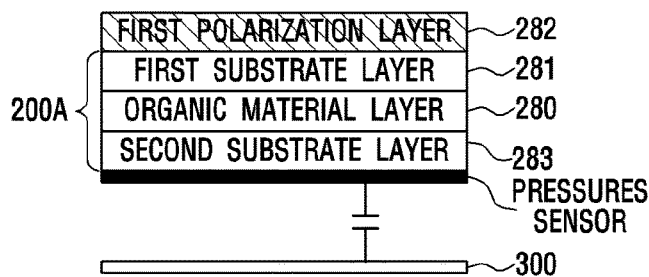

[Fig. 6c]
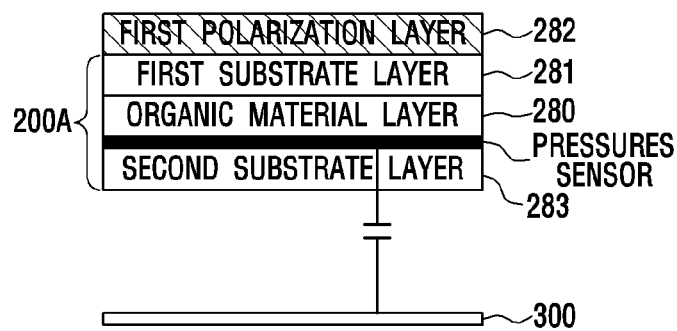
[Fig. 7a]
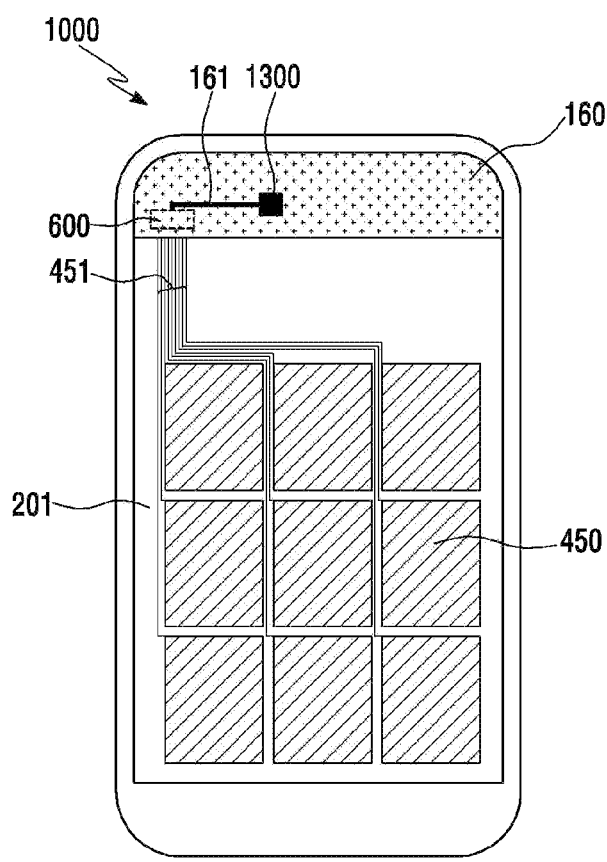

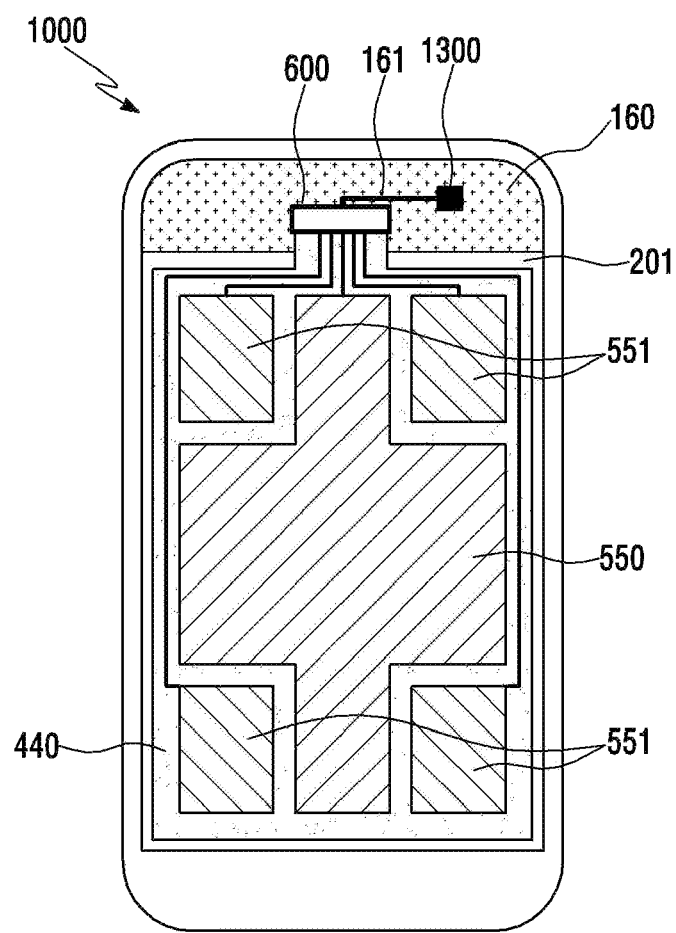
[Fig. 7b]

[Fig. 7c]
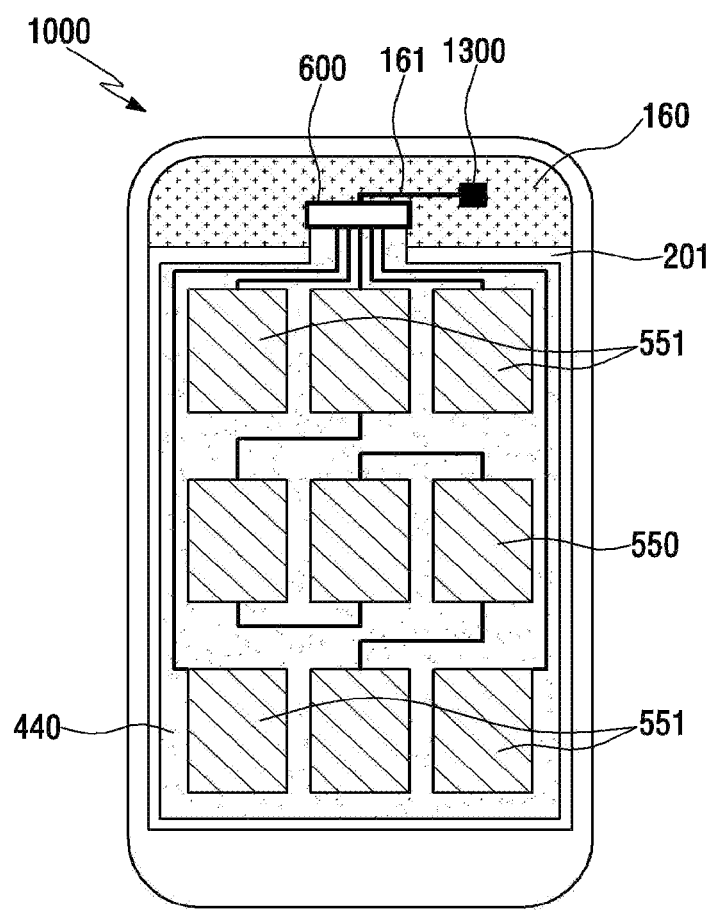

[Fig. 7d]
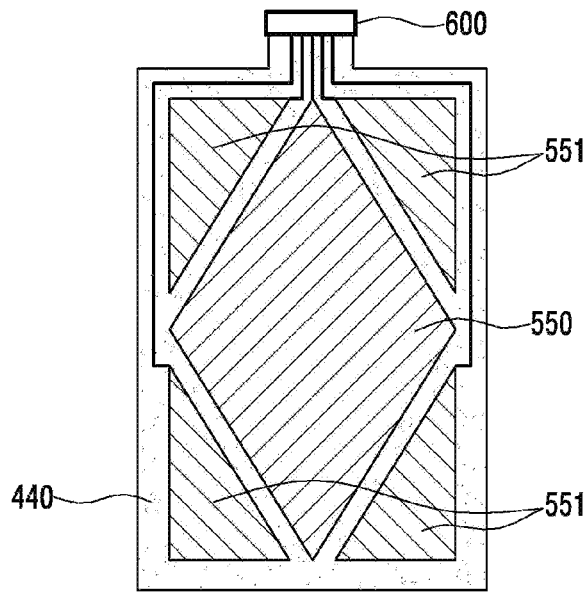
[Fig. 7e]
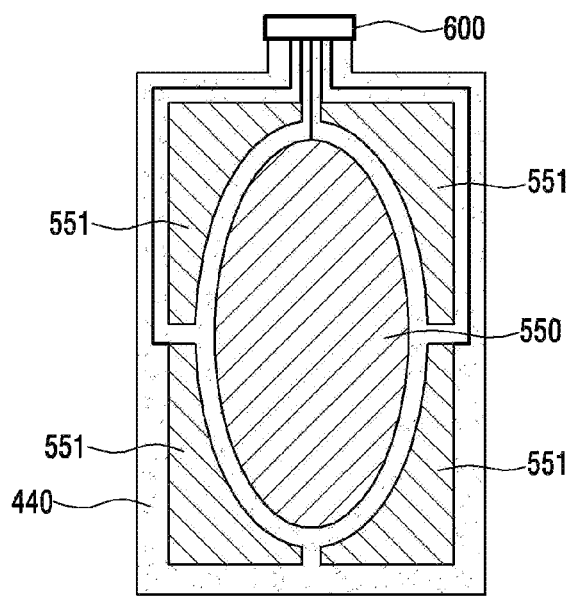

[Fig. 7f]
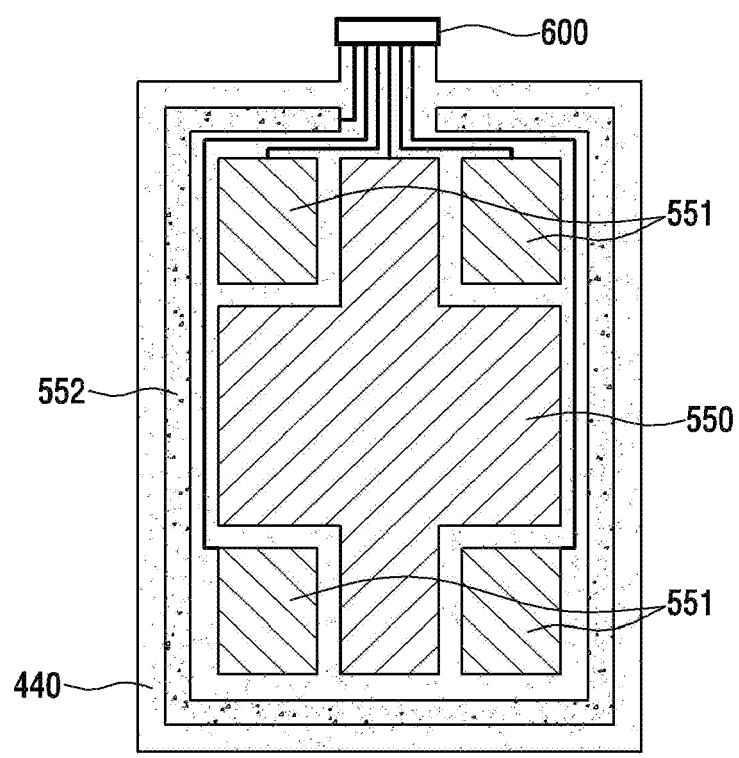

[Fig. 7g]
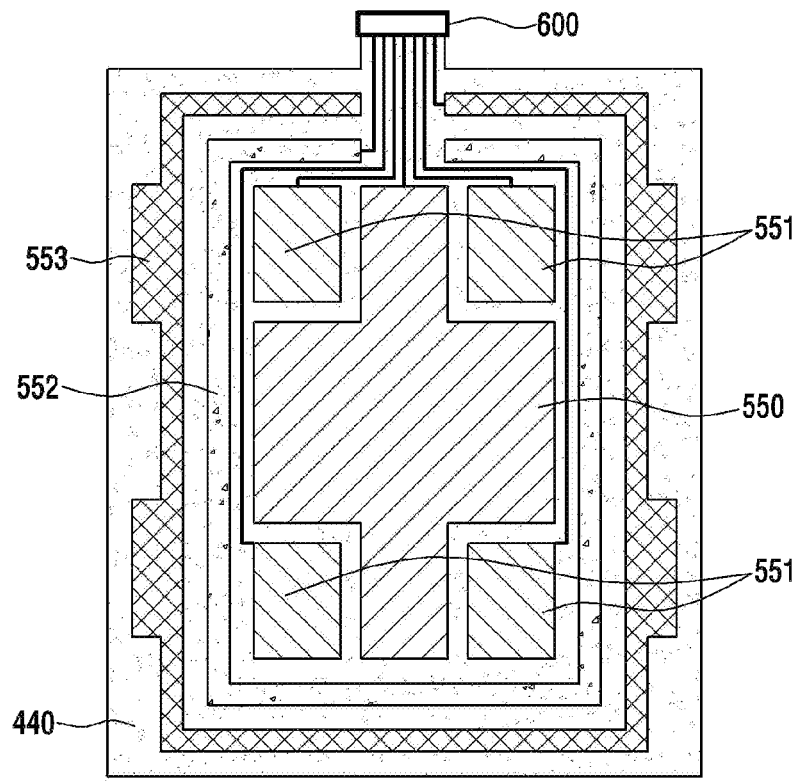
[Fig. 7h]
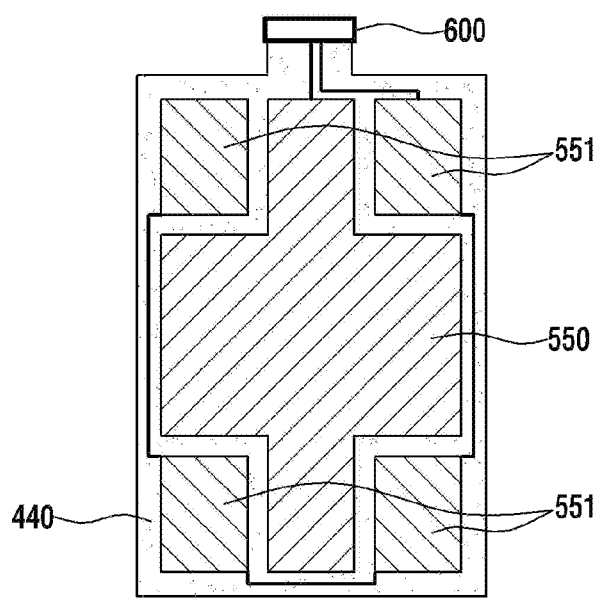

[Fig. 7i]
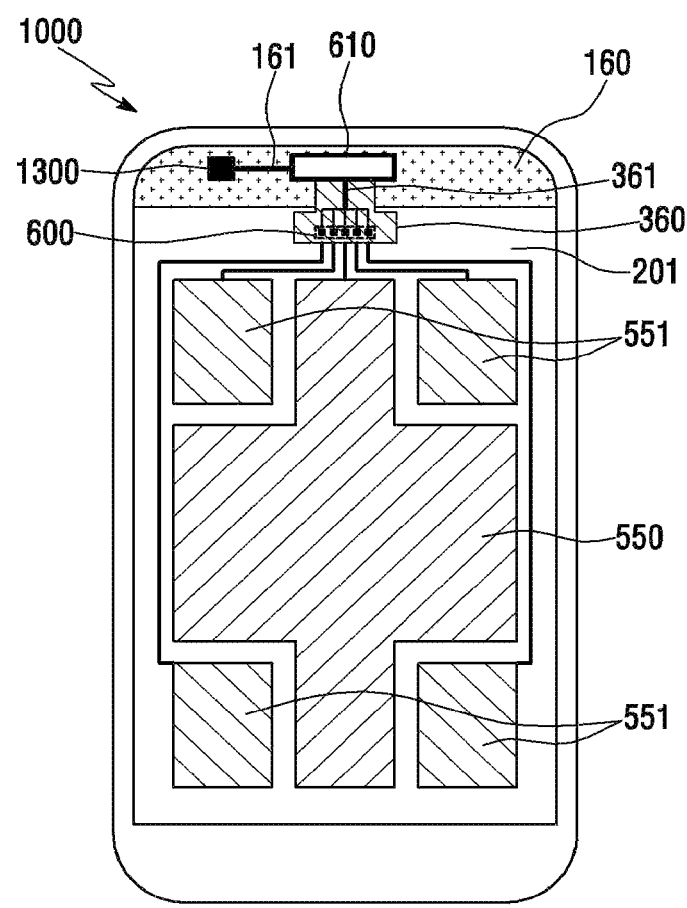

[Fig. 7j]
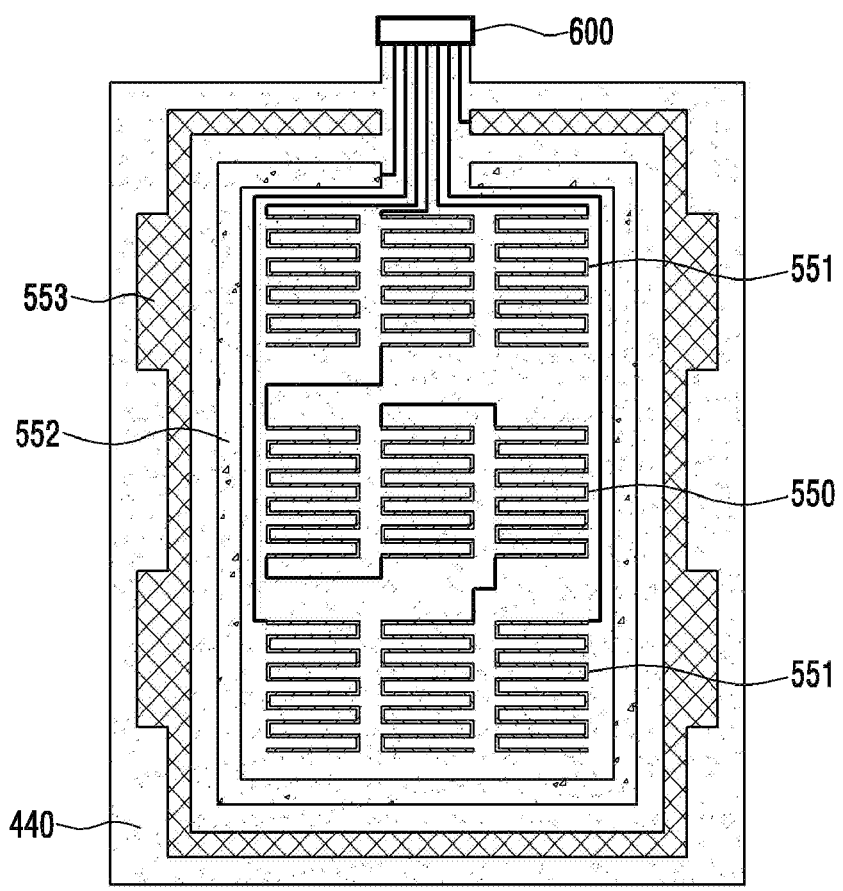

【Fig. 8a】
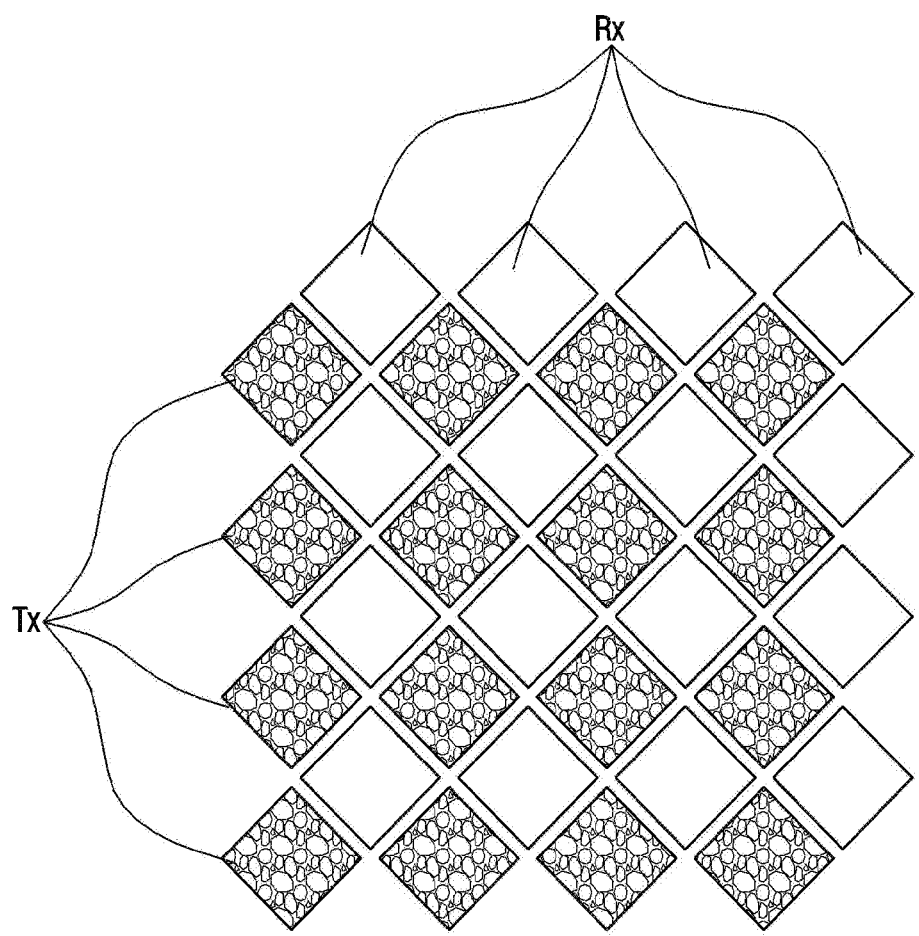

[Fig. 8b]
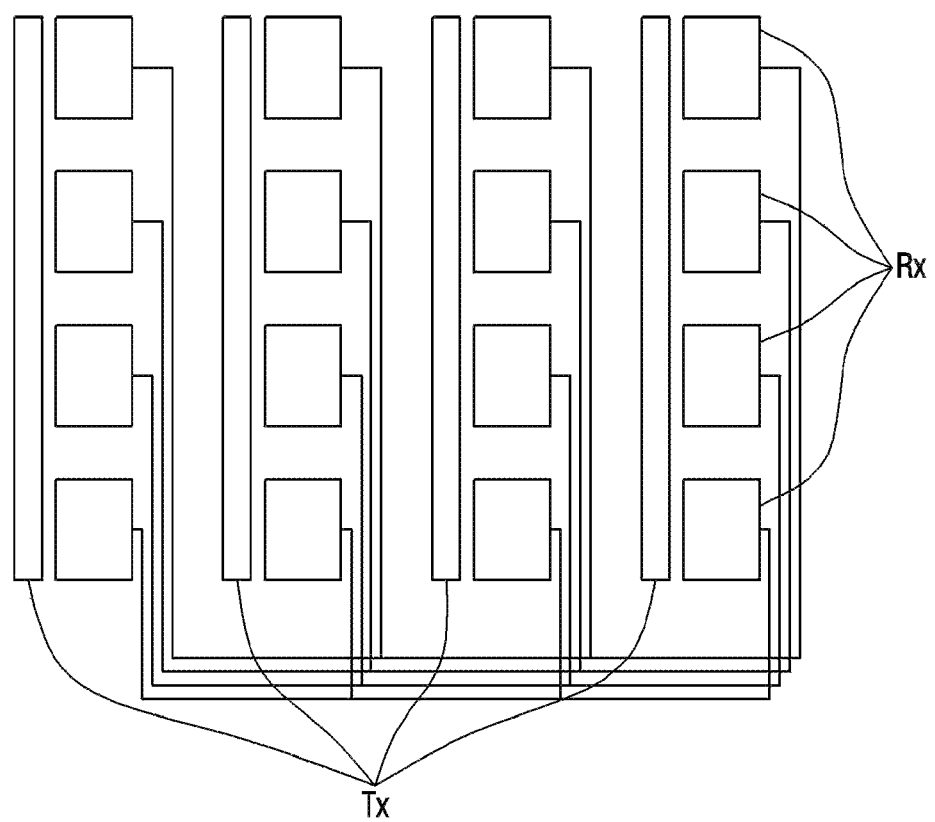

【Fig. 8c】
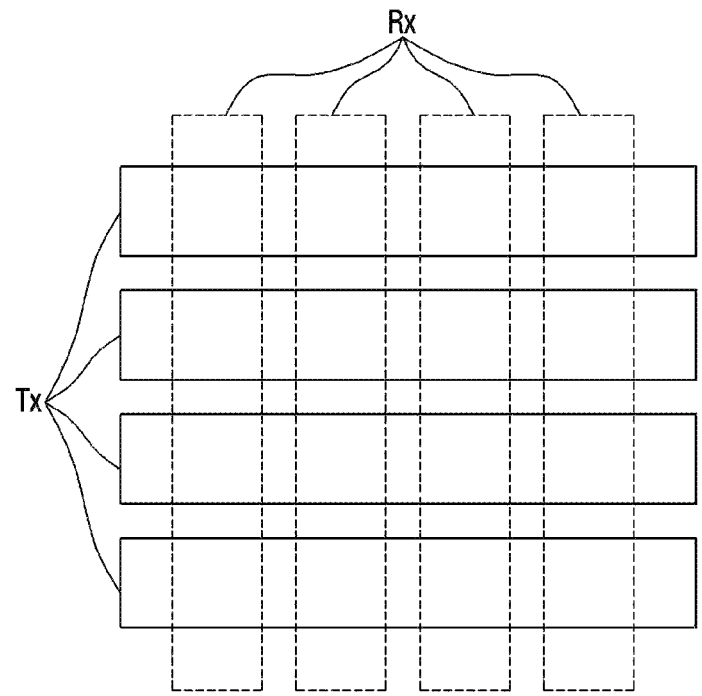
【Fig. 8d】
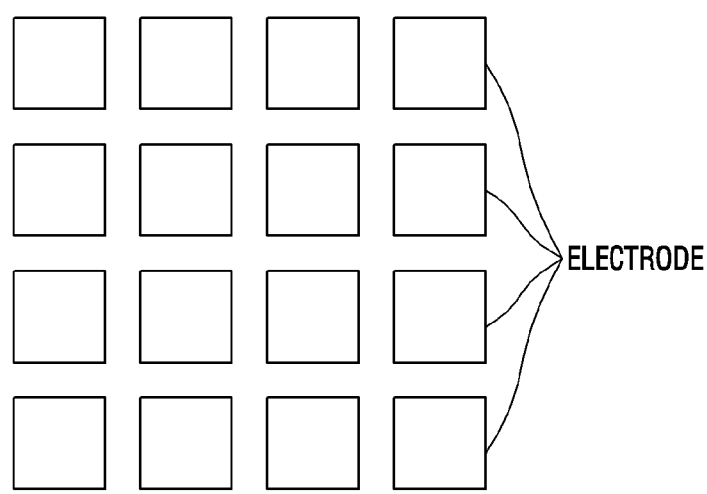

PRESSURE SENSING UNIT AND TOUCH INPUT DEVICE INCLUDING THE SAME

CROSS REFERENCE TO RELATED APPLICATIONS

Priority is claimed under 35 U.S.C. § 119 to Korean Patent Application No. 10-2016-0155876, filed Nov. 22, 2016, which is incorporated herein by reference in its entirety.

BACKGROUND

Field

The present disclosure relates to a pressure sensing unit and a touch input device including the same, and more particularly to a pressure sensing unit which maintains the sensitivity thereof and includes the reduced number of channels, and a touch input device including the pressure sensing unit.

Description of the Related Art

Various kinds of input devices are being used to operate a computing system. For example, the input device includes a button, key, joystick and touch screen. Since the touch screen is easy and simple to operate, the touch screen is increasingly being used in operation of a computing system.

A touch surface of a touch input device may be composed of a transparent panel including a touch-sensitive surface and of a touch sensor which is a touch input means. The touch sensor is attached to the front side of a display screen, so that the touch-sensitive surface may cover the visible side of the display screen. The touch sensor allows a user to simply touch the touch screen with user's finger, etc., and to operate the computing system. Generally, the computing system may recognize the touch and a position of the touch on the touch screen, and then analyze the touch and perform operations accordingly.

The pressure sensing unit for detecting a touch pressure in the touch input device includes not only a plurality of pressure sensors but also a reference sensor for compensating for the effect caused by a temperature or display noise, etc., and/or an ESD protective electrode capable of reducing the effect of ESD. With the increase of the number of channels included in the pressure sensing unit, the number of required pins of a pressure sensor controller increases, an area required for the connection of the pressure sensing unit and a FPCB becomes larger, and a connection structure between the pressure sensing unit and the FPCB also becomes more complicated. Therefore, there is a demand for reducing the number of the channels included in the pressure sensing unit while maintaining the sensitivity of the pressure sensing unit.

BRIEF SUMMARY

One embodiment is a touch input device capable of detecting a touch pressure. The touch input device includes: a display panel; and a pressure sensing unit which is disposed under the display panel. The pressure sensing unit includes one central pressure sensor for detecting the pressure and a plurality of non-central pressure sensors for detecting the pressure. An area of each of the non-central pressure sensors is less than that of the central pressure sensor.

Another embodiment is a touch input device capable of detecting a touch pressure. The touch input device includes: a display panel; and a pressure sensing unit which is disposed under the display panel. The pressure sensing unit includes one central pressure sensor for detecting the pressure, which is composed of a plurality of pressure sensors connected to each other, and a plurality of non-central pressure sensors for detecting the pressure. An area of each of the non-central pressure sensors is less than a summation of the plurality of the pressure sensors.

Further another embodiment is a pressure sensing unit which is disposed under a display panel of a touch input device including the display panel and is used to detect a touch pressure. The pressure sensing unit includes: a first insulation layer; a second insulation layer; and one central pressure sensor for detecting the pressure, which is disposed between the first insulation layer and the second insulation layer, and a plurality of non-central pressure sensors for detecting the pressure, which are disposed between the first insulation layer and the second insulation layer. An area of each of the non-central pressure sensors is less than that of the central pressure sensor.

Yet another embodiment is a pressure sensing unit which is disposed under a display panel of a touch input device including the display panel and is used to detect a touch pressure. The pressure sensing unit includes: a first insulation layer; a second insulation layer; and one central pressure sensor for detecting the pressure, which is disposed between the first insulation layer and the second insulation layer and is composed of a plurality of pressure sensors connected to each other, and a plurality of non-central pressure sensors for detecting the pressure, which are disposed between the first insulation layer and the second insulation layer. An area of each of the non-central pressure sensors is less than a summation of the plurality of the pressure sensors.

BRIEF DESCRIPTION OF THE DRAWINGS

The present disclosure will become more fully understood from the detailed description and the accompanying drawings, wherein:

FIGS. 1a and 1b are schematic views of a configuration of a capacitance type touch sensor included in a touch input device according to an embodiment of the present invention and the operation of the capacitance type touch sensor;

FIG. 2 shows a control block for controlling a touch position, a touch pressure and a display operation in the touch input device according to the embodiment of the present invention;

FIGS. 3a to 3b are conceptual views for describing a configuration of a display module in the touch input device according to the embodiment of the present invention;

FIGS. 4a to 4g show an example in which a pressure sensor is formed in the in the touch input device according to the embodiment of the present invention;

FIG. 5 shows a cross section of a sensor sheet according to the embodiment of the present invention;

FIGS. 6a to 6c are cross sectional views showing an embodiment of the pressure sensor formed directly on various display panel of the touch input device according to the embodiment of the present invention;

FIG. 7a is a view of a portion of the touch input device according to the embodiment of the present invention as viewed in an opposite direction of a touch surface;

FIGS. 7b and 7c are views of a portion of the touch input device in which a pressure sensing unit according to the embodiment of the present invention has been disposed, as viewed in the opposite direction of the touch surface;

FIGS. 7d to 7h are plan views of the pressure sensing unit according to the embodiment of the present invention;

FIG. 7i is a view of a portion of the touch input device in which another pressure sensing unit according to the embodiment of the present invention has been disposed, as viewed in the opposite direction of the touch surface;

FIG. 7j is a plan view of another pressure sensing unit according to the embodiment of the present invention; and FIGS. 8a to 8d are views showing a form of a sensor included in the touch input device according to the embodiment of the present invention.

DETAILED DESCRIPTION

The following detailed description of the present invention shows a specified embodiment of the present invention and will be provided with reference to the accompanying drawings. The embodiment will be described in enough detail that those skilled in the art are able to embody the present invention. It should be understood that various embodiments of the present invention are different from each other and need not be mutually exclusive. For example, a specific shape, structure and properties, which are described in this disclosure, may be implemented in other embodiments without departing from the spirit and scope of the present invention with respect to one embodiment. Also, it should be noted that positions or placements of individual components within each disclosed embodiment may be changed without departing from the spirit and scope of the present invention. Similar reference numerals in the drawings designate the same or similar functions in many aspects.

Hereafter, a touch input device capable of detecting a pressure in accordance with the embodiment of the present invention will be described with reference to the accompanying drawings. While a capacitance type touch sensor 10 is exemplified below, the touch sensor 10 capable of detecting a touch position in any manner may be applied.

FIG. 1a is schematic views of a configuration of the capacitance type touch sensor 10 included in the touch input device according to the embodiment of the present invention and the operation of the capacitance type touch sensor. Referring to FIG. 1a, the touch sensor 10 may include a plurality of drive electrodes TX1 to TXn and a plurality of receiving electrodes RX1 to RXm, and may include a drive unit 12 which applies a drive signal to the plurality of the drive electrodes TX1 to TXn for the purpose of the operation of the touch sensor 10, and a sensing unit 11 which detects the touch and the touch position by receiving from the plurality of the receiving electrodes RX1 to RXm a sensing signal including information on a capacitance change amount changing according to the touch on a touch surface.

As shown in FIG. 1a, the touch sensor 10 may include the plurality of drive electrodes TX1 to TXn and the plurality of receiving electrodes RX1 to RXm. While FIG. 1a shows that the plurality of drive electrodes TX1 to TXn and the plurality of receiving electrodes RX1 to RXm of the touch sensor 10 form an orthogonal array, the present invention is not limited to this. The plurality of drive electrodes TX1 to TXn and the plurality of receiving electrodes RX1 to RXm has an array of arbitrary dimension, for example, a diagonal array, a concentric array, a 3-dimensional random array, etc., and an array obtained by the application of them. Here, "n" and "m" are positive integers and may be the same as each other or may have different values. The magnitude of the value may be changed depending on the embodiment.

The plurality of drive electrodes TX1 to TXn and the plurality of receiving electrodes RX1 to RXm may be arranged to cross each other. The drive electrode TX may include the plurality of drive electrodes TX1 to TXn extending in a first axial direction. The receiving electrode RX may include the plurality of receiving electrodes RX1 to RXm extending in a second axial direction crossing the first axial direction.

As shown in FIGS. 8a and 8b, in the touch sensor 10 according to the embodiment of the present invention, the plurality of drive electrodes TX1 to TXn and the plurality of receiving electrodes RX1 to RXm may be formed in the same layer. For example, the plurality of drive electrodes TX1 to TXn and the plurality of receiving electrodes RX1 to RXm may be formed on a top surface of a display panel 200A to be described later.

Also, as shown in FIG. 8c, the plurality of drive electrodes TX1 to TXn and the plurality of receiving electrodes RX1 to RXm may be formed in different layers. For example, any one of the plurality of drive electrodes TX1 to TXn and the plurality of receiving electrodes RX1 to RXm may be formed on the top surface of the display panel 200A, and the other may be formed on a bottom surface of a cover to be described later or may be formed within the display panel 200A.

The plurality of drive electrodes TX1 to TXn and the plurality of receiving electrodes RX1 to RXm may be made of a transparent conductive material (for example, indium tin oxide (ITO) or antimony tin oxide (ATO) which is made of tin oxide ($SnO_2$), and indium oxide ($In_2O_3$), etc.), or the like. However, this is only an example. The drive electrode TX and the receiving electrode RX may be also made of another transparent conductive material or an opaque conductive material. For instance, the drive electrode TX and the receiving electrode RX may include at least any one of silver ink, copper, and carbon nanotube (CNT). Also, the drive electrode TX and the receiving electrode RX may be made of metal mesh.

The drive unit 12 according to the embodiment of the present invention may apply a drive signal to the drive electrodes TX1 to TXn. In the embodiment of the present invention, one drive signal may be sequentially applied at a time to the first drive electrode TX1 to the n-th drive electrode TXn. The drive signal may be applied again repeatedly. This is only an example. The drive signal may be applied to the plurality of drive electrodes at the same time in accordance with the embodiment.

Through the receiving electrodes RX1 to RXm, the sensing unit 11 receives the sensing signal including information on a capacitance (Cm) 14 generated between the receiving electrodes RX1 to RXm and the drive electrodes TX1 to TXn to which the driving signal has been applied, thereby detecting whether or not the touch has occurred and where the touch has occurred. For example, the sensing signal may be a signal coupled by the capacitance (Cm) 14 generated between the receiving electrode RX and the drive electrode TX to which the driving signal has been applied. As such, the process of sensing the driving signal applied from the first drive electrode TX1 to the n-th drive electrode TXn through the receiving electrodes RX1 to RXm can be referred to as a process of scanning the touch sensor 10.

For example, the sensing unit 11 may include a receiver (not shown) which is connected to each of the receiving electrodes RX1 to RXm through a switch. The switch becomes the on-state in a time interval during which the signal of the corresponding receiving electrode RX is sensed, thereby allowing the receiver to sense the sensing signal from the receiving electrode RX. The receiver may include an amplifier (not shown) and a feedback capacitor coupled between the negative (−) input terminal of the amplifier and the output terminal of the amplifier, i.e., coupled to a feedback path. Here, the positive (+) input terminal of the amplifier may be connected to the ground. Also, the receiver may further include a reset switch which is connected in parallel with the feedback capacitor. The reset switch may reset the conversion from current to voltage that is performed by the receiver. The negative input terminal of the amplifier is connected to the corresponding receiving electrode RX and receives and integrates a current signal including information on the capacitance (Cm) 14, and then converts the integrated current signal into voltage. The sensing unit 11 may further include an analog to digital converter (ADC) (not shown) which converts the integrated data by the receiver into digital data. Later, the digital data may be input to a processor (not shown) and processed to obtain information on the touch on the touch sensor 10. The sensing unit 11 may include the ADC and processor as well as the receiver.

A controller 13 may perform a function of controlling the operations of the drive unit 12 and the sensing unit 11. For example, the controller 13 generates and transmits a drive control signal to the drive unit 12, so that the driving signal can be applied to a predetermined drive electrode TX1 at a predetermined time. Also, the controller 13 generates and transmits the drive control signal to the sensing unit 11, so that the sensing unit 11 may receive the sensing signal from the predetermined receiving electrode RX at a predetermined time and perform a predetermined function.

In FIG. 1*a*, the drive unit 12 and the sensing unit 11 may constitute a touch detection device (not shown) capable of detecting whether the touch has occurred on the touch sensor 10 or not and where the touch has occurred. The touch detection device may further include the controller 13. In the touch input device including the touch sensor 10, the touch detection device may be integrated and implemented on a touch sensing integrated circuit (IC) corresponding to a below-described touch sensor controller 1100. The drive electrode TX and the receiving electrode RX included in the touch sensor 10 may be connected to the drive unit 12 and the sensing unit 11 included in the touch sensing IC through, for example, a conductive trace and/or a conductive pattern printed on a circuit board, or the like. The touch sensing IC may be placed on a circuit board on which the conductive pattern has been printed, for example, a touch circuit board (hereafter, referred to as a touch PCB). According to the embodiment, the touch sensing IC may be mounted on a main board for operation of the touch input device.

As described above, a capacitance (Cm) with a predetermined value is generated at each crossing of the drive electrode TX and the receiving electrode RX. When an object like a finger approaches close to the touch sensor 10, the value of the capacitance may be changed. In FIG. 1*a*, the capacitance may represent a mutual capacitance (Cm). The sensing unit 11 senses such electrical characteristics, thereby being able to sense whether the touch has occurred on the touch sensor 10 or not and where the touch has occurred. For example, the sensing unit 11 is able to sense whether the touch has occurred on the surface of the touch sensor 10 comprised of a two-dimensional plane consisting of a first axis and a second axis.

More specifically, when the touch occurs on the touch sensor 10, the drive electrode TX to which the driving signal has been applied is detected, so that the position of the second axial direction of the touch can be detected. Likewise, when the touch occurs on the touch sensor 10, the capacitance change is detected from the reception signal received through the receiving electrode RX, so that the position of the first axial direction of the touch can be detected.

Up to now, although the operation mode of the touch sensor 10 sensing the touch position has been described on the basis of the mutual capacitance change amount between the drive electrode TX and the receiving electrode RX, the embodiment of the present invention is not limited to this. That is, as shown in FIG. 1*b*, it is also possible to detect the touch position on the basis of the change amount of a self-capacitance.

FIG. 1*b* is schematic views of a configuration of another capacitance type touch sensor 10 included in the touch input device according to another embodiment of the present invention and the operation of the capacitance type touch sensor. A plurality of touch electrodes 30 are provided on the touch sensor 10 shown in FIG. 1*b*. Although the plurality of touch electrodes 30 may be, as shown in FIG. 8*d*, disposed at a regular interval in the form of a grid, the present invention is not limited to this.

The drive control signal generated by the controller 13 is transmitted to the drive unit 12. On the basis of the drive control signal, the drive unit 12 applies the drive signal to the predetermined touch electrode 30 for a predetermined time period. Also, the drive control signal generated by the controller 13 is transmitted to the sensing unit 11. On the basis of the drive control signal, the sensing unit 11 receives the sensing signal from the predetermined touch electrode 30 for a predetermined time period. Here, the sensing signal may be a signal for the change amount of the self-capacitance formed on the touch electrode 30.

Here, whether the touch has occurred on the touch sensor 10 or not and/or the touch position are detected by the sensing signal detected by the sensing unit 11. For example, since the coordinate of the touch electrode 30 has been known in advance, whether the touch of the object on the surface of the touch sensor 10 has occurred or not and/or the touch position can be detected.

In the foregoing, for convenience of description, it has been described that the drive unit 12 and the sensing unit 11 operate individually as a separate block. However, the operation to apply the drive signal to the touch electrode 30 and to receive the sensing signal from the touch electrode 30 can be also performed by one drive and sensing unit.

The foregoing has described in detail the capacitance type touch sensor as the touch sensor 10. However, in the touch input device 1000 according to the embodiment of the present invention, the touch sensor 10 for detecting whether or not the touch has occurred and the touch position may be implemented by using not only the above-described method but also any touch sensing method such as a surface capacitance type method, a projected capacitance type method, a resistance film method, a surface acoustic wave (SAW) method, an infrared method, an optical imaging method, a dispersive signal technology, and an acoustic pulse recognition method, etc.

FIG. 2 shows a control block for controlling the touch position, a touch pressure and a display operation in the touch input device according to the embodiment of the present invention. In the touch input device 1000 configured to detect the touch pressure in addition to the display function and touch position detection, the control block may include the above-described touch sensor controller 1100 for detecting the touch position, a display controller 1200 for driving the display panel, and a pressure sensor controller 1300 for detecting the pressure. The display controller 1200 may include a control circuit which receives an input from an application processor (AP) or a central processing unit (CPU) on a main board for the operation of the touch input device 1000 and displays the contents that the user wants on the display panel 200A. The control circuit may be mounted on a display circuit board (hereafter, referred to as a display PCB). The control circuit may include a display panel control IC, a graphic controller IC, and a circuit required to operate other display panel 200A.

The pressure sensor controller 1300 for detecting the pressure through a pressure sensing unit may be configured similarly to the touch sensor controller 1100, and thus, may operate similarly to the touch sensor controller 1100. Specifically, as shown in FIGS. 1a and 1b, the pressure sensor controller 1300 may include the drive unit, the sensing unit, and the controller, and may detect a magnitude of the pressure by the sensing signal sensed by the sensing unit. Here, the pressure sensor controller 1300 may be mounted on the touch PCB on which the touch sensor controller 1100 has been mounted or may be mounted on the display PCB on which the display controller 1200 has been mounted.

According to the embodiment, the touch sensor controller 1100, the display controller 1200, and the pressure sensor controller 1300 may be included as different components in the touch input device 1000. For example, the touch sensor controller 1100, the display controller 1200, and the pressure sensor controller 1300 may be composed of different chips respectively. Here, a processor 1500 of the touch input device 1000 may function as a host processor for the touch sensor controller 1100, the display controller 1200, and the pressure sensor controller 1300.

The touch input device 1000 according to the embodiment of the present invention may include an electronic device including a display screen and/or a touch screen, such as a cell phone, a personal data assistant (PDA), a smartphone, a tablet personal computer (PC).

In order to manufacture such a thin and lightweight light-weighing touch input device 1000, the touch sensor controller 1100, the display controller 1200, and the pressure sensor controller 1300, which are, as described above, formed separately from each other, may be integrated into one or more configurations in accordance with the embodiment of the present invention. In addition to this, these controllers can be integrated into the processor 1500 respectively. Also, according to the embodiment of the present invention, the touch sensor 10 and/or the pressure sensing unit may be integrated into the display panel 200A.

In the touch input device 1000 according to the embodiment of the present invention, the touch sensor 10 for detecting the touch position may be positioned outside or inside the display panel 200A. The display panel 200A of the touch input device 1000 according to the embodiment of the present invention may be a display panel included in a liquid crystal display (LCD), a plasma display panel (PDP), an organic light emitting diode (OLED), etc. Accordingly, a user may perform the input operation by touching the touch surface while visually identifying an image displayed on the display panel.

FIGS. 3a and 3b are conceptual views for describing a configuration of a display module 200 in the touch input device 1000 according to the embodiment of the present invention. First, the configuration of the display module 200 including the display panel 200A using an LCD panel will be described with reference to FIG. 3a.

As shown in FIG. 3a, the display module 200 may include the display panel 200A that is an LCD panel, a first polarization layer 271 disposed on the display panel 200A, and a second polarization layer 272 disposed under the display panel 200A. The display panel 200A that is an LCD panel may include a liquid crystal layer 250 including a liquid crystal cell, a first substrate layer 261 disposed on the liquid crystal layer 250, and a second substrate layer 262 disposed under the liquid crystal layer 250. Here, the first substrate layer 261 may be made of color filter glass, and the second substrate layer 262 may be made of TFT glass. Also, according to the embodiment, at least one of the first substrate layer 261 and the second substrate layer 262 may be made of a bendable material such as plastic. In FIG. 3a, the second substrate layer 262 may be comprised of various layers including a data line, a gate line, TFT, a common electrode, and a pixel electrode, etc. These electrical components may operate in such a manner as to generate a controlled electric field and orient liquid crystals located in the liquid crystal layer 250.

Next, the configuration of the display module 200 including the display panel 200A using an OLED panel will be described with reference to FIG. 3b.

As shown in FIG. 3b, the display module 200 may include the display panel 200A that is an OLED panel, and a first polarization layer 282 disposed on the display panel 200A. The display panel 200A that is an OLED panel may include an organic material layer 280 including an organic light-emitting diode (OLED), a first substrate layer 281 disposed on the organic material layer 280, and a second substrate layer 283 disposed under the organic material layer 280. Here, the first substrate layer 281 may be made of encapsulation glass, and the second substrate layer 283 may be made of TFT glass. Also, according to the embodiment, at least one of the first substrate layer 281 and the second substrate layer 283 may be made of a bendable material such as plastic. The OLED panel shown in FIGS. 3d to 3f may include an electrode used to drive the display panel 200A, such as a gate line, a data line, a first power line (ELVDD), a second power line (ELVSS), etc. The organic light-emitting diode (OLED) panel is a self-light emitting display panel which uses a principle where, when current flows through a fluorescent or phosphorescent organic thin film and then electrons and electron holes are combined in the organic material layer, so that light is generated. The organic material constituting the light emitting layer determines the color of the light.

Specifically, the OLED uses a principle in which when electricity flows and an organic matter is applied on glass or plastic, the organic matter emits light. That is, the principle is that electron holes and electrons are injected into the anode and cathode of the organic matter respectively and are recombined in the light emitting layer, so that a high energy exciton is generated and the exciton releases the energy while falling down to a low energy state and then light with a particular wavelength is generated. Here, the color of the light is changed according to the organic matter of the light emitting layer.

The OLED includes a line-driven passive-matrix organic light-emitting diode (PM-OLED) and an individual driven active-matrix organic light-emitting diode (AM-OLED) in accordance with the operating characteristics of a pixel constituting a pixel matrix. None of them require a backlight. Therefore, the OLED enables a very thin display module to be implemented, has a constant contrast ratio according to an angle and obtains a good color reproductivity depending on a temperature. Also, it is very economical in that non-driven pixel does not consume power.

In terms of operation, the PM-OLED emits light only during a scanning time at a high current, and the AM-OLED maintains a light emitting state only during a frame time at a low current. Therefore, the AM-OLED has a resolution higher than that of the PM-OLED and is advantageous for driving a large area display panel and consumes low power. Also, a thin film transistor (TFT) is embedded in the AM-OLED, and thus, each component can be individually controlled, so that it is easy to implement a delicate screen.

Also, the organic material layer 280 may include a hole injection layer (HIL), a hole transport layer (HTL), an electron injection layer (EIL), an electron transport layer (ETL), and a light-emitting layer (EML).

Briefly describing each of the layers, HIL injects electron holes and is made of a material such as CuPc, etc. HTL functions to move the injected electron holes and mainly is made of a material having a good hole mobility. Arylamine, TPD, and the like may be used as the HTL. The EIL and ETL inject and transport electrons. The injected electrons and electron holes are combined in the EML and emit light. The EML represents the color of the emitted light and is composed of a host determining the lifespan of the organic matter and an impurity (dopant) determining the color sense and efficiency. This just describes the basic structure of the organic material layer 280 include in the OLED panel. The present invention is not limited to the layer structure or material, etc., of the organic material layer 280.

The organic material layer 280 is inserted between an anode (not shown) and a cathode (not shown). When the TFT becomes an on-state, a driving current is applied to the anode and the electron holes are injected, and the electrons are injected to the cathode. Then, the electron holes and electrons move to the organic material layer 280 and emit the light.

It will be apparent to a skilled person in the art that the LCD panel or the OLED panel may further include other structures so as to perform the display function and may be transformed.

The display module 200 of the touch input device 1000 according to the embodiment of the present invention may include the display panel 200A and a configuration for driving the display panel 200A. Specifically, when the display panel 200A is an LCD panel, the display module 200 may include a backlight unit (not shown) disposed under the second polarization layer 272 and may further include a display panel control IC for operation of the LCD panel, a graphic control IC, and other circuits.

In the touch input device 1000 according to the embodiment of the present invention, the touch sensor 10 for detecting the touch position may be positioned outside or inside the display module 200.

When the touch sensor 10 in the touch input device 1000 positioned outside the display module 200, the touch sensor panel may be disposed on the display module 200, and the touch sensor 10 may be included in the touch sensor panel. The touch surface of the touch input device 1000 may be the surface of the touch sensor panel.

When the touch sensor 10 in the touch input device 1000 positioned inside the display module 200, the touch sensor 10 may be configured to be positioned outside the display panel 200A. Specifically, the touch sensor 10 may be formed on the top surfaces of the first substrate layers 261 and 281. Here, the touch surface of the touch input device 1000 may be an outer surface of the display module 200 and may be the top surface or bottom surface in FIGS. 3 and 3*b*.

When the touch sensor 10 in the touch input device 1000 positioned inside the display module 200, at least a portion of the touch sensor 10 may be configured to be positioned inside the display panel 200A, and at least a portion of the remaining touch sensor 10 may be configured to be positioned outside the display panel 200A. For example, any one of the drive electrode TX and the receiving electrode RX, which constitute the touch sensor 10, may be configured to be positioned outside the display panel 200A, and the other may be configured to be positioned inside the display panel 200A. Specifically, any one of the drive electrode TX and the receiving electrode RX, which constitute the touch sensor 10, may be formed on the top surface of the top surfaces of the first substrate layers 261 and 281, and the other may be formed on the bottom surfaces of the first substrate layers 261 and 281 or may be formed on the top surfaces of the second substrate layers 262 and 283.

When the touch sensor 10 in the touch input device 1000 positioned inside the display module 200, the touch sensor 10 may be configured to be positioned inside the display panel 200A. Specifically, the touch sensor 10 may be formed on the bottom surfaces of the first substrate layers 261 and 281 or may be formed on the top surfaces of the second substrate layers 262 and 283.

When the touch sensor 10 is positioned inside the display panel 200A, an electrode for operation of the touch sensor may be additionally disposed. However, various configurations and/or electrodes positioned inside the display panel 200A may be used as the touch sensor 10 for sensing the touch. Specifically, when the display panel 200A is the LCD panel, at least any one of the electrodes included in the touch sensor 10 may include at least any one of a data line, a gate line, TFT, a common electrode (Vcom), and a pixel electrode. When the display panel 200A is the OLED panel, at least any one of the electrodes included in the touch sensor 10 may include at least any one of a data line, a gate line, a first power line (ELVDD), and a second power line (ELVSS).

Here, the touch sensor 10 may function as the drive electrode and the receiving electrode described in FIG. 1*a* and may detect the touch position in accordance with the mutual capacitance between the drive electrode and the receiving electrode. Also, the touch sensor 10 may function as the single electrode 30 described in FIG. 1*b* and may detect the touch position in accordance with the self-capacitance of each of the single electrodes 30. Here, if the electrode included in the touch sensor 10 is used to drive the display panel 200A, the touch sensor 10 may drive the display panel 200A in a first time interval and may detect the touch position in a second time interval different from the first time interval.

Hereafter, in order to detect the touch pressure in the touch input device according to the embodiment of the present invention, the following detailed description will be provided by taking an example of a case where a separate sensor which is different from the electrode used to detect the touch position and the electrode used to drive the display is disposed and used as the pressure sensing unit.

In the touch input device 1000 according to the embodiment of the present invention, by means of an adhesive like an optically clear adhesive (OCA), lamination may occur between a cover layer 100 on which the touch sensor for detecting the touch position has been formed and the display module 200 including the display panel 200A. As a result, the display color clarity, visibility and optical transmittance of the display module 200, which can be recognized through the touch surface of the touch sensor, can be improved.

FIGS. 4a to 4g show an example in which the pressure sensor is formed in the in the touch input device according to the embodiment of the present invention.

In FIG. 4a and some of the following figures, it is shown that the display panel 200A is directly laminated on and attached to the cover layer 100. However, this is only for convenience of description. The display module 200 where the first polarization layers 271 and 282 is located on the display panel 200A may be laminated on and attached to the cover layer 100. When the LCD panel is the display panel 200A, the second polarization layer 272 and the backlight unit are omitted.

In the description with reference to FIGS. 4a to 4g, it is shown that as the touch input device 1000 according to the embodiment of the present invention, the cover layer 100 in which the touch sensor has been formed is laminated on and attached to the display module 200 shown in FIGS. 3a and 3b by means of an adhesive. However, the touch input device 1000 according to the embodiment of the present invention may include that the touch sensor 10 is disposed inside the display module 200 shown in FIGS. 3a and 3b. More specifically, while FIGS. 4a to 4d show that the cover layer 100 where the touch sensor 10 has been formed covers the display module 200 including the display panel 200A, the touch input device 1000 which includes the touch sensor 10 disposed inside the display module 200 and includes the display module 200 covered with the cover layer 100 like glass may be used as the embodiment of the present invention.

The touch input device 1000 according to the embodiment of the present invention may include an electronic device including the touch screen, for example, a cell phone, a personal data assistant (PDA), a smart phone, a tablet personal computer, an MP3 player, a laptop computer, etc.

In the touch input device 1000 according to the embodiment of the present invention, a substrate 300, together with an outermost housing 320 of the touch input device 1000, may function to surround a mounting space 310, etc., where the circuit board and/or battery for operation of the touch input device 1000 are placed. Here, the circuit board for operation of the touch input device 1000 may be a main board. A central processing unit (CPU), an application processor (AP) or the like may be mounted on the circuit board. Due to the substrate 300, the display module 200 is separated from the circuit board and/or battery for operation of the touch input device 1000. Due to the substrate 300, electrical noise generated from the display module 200 and noise generated from the circuit board can be blocked.

The touch sensor 10 or the cover layer 100 of the touch input device 1000 may be formed wider than the display module 200, the substrate 300, and the mounting space 310. As a result, the housing 320 may be formed such that the housing 320, together with the touch sensor 10, surrounds the display module 200, the substrate 300, and the circuit board.

The touch input device 1000 according to the embodiment of the present invention may detect the touch position through the touch sensor 10 and may detect the touch pressure by disposing a separate sensor which is different from the electrode used to detect the touch position and the electrode used to drive the display and by using the separate sensor as the pressure sensing unit. Here, the touch sensor 10 may be disposed inside or outside the display module 200.

Hereafter, the components for detecting the pressure are collectively referred to as the pressure sensing unit. For example, the pressure sensing unit of the embodiment shown in FIG. 4a may include a sensor sheet 440, and the pressure sensing unit of the embodiment shown in FIG. 4b may include pressure sensors 450 and 460.

In the touch input device according to the embodiment of the present invention, as shown in FIG. 4a, the sensor sheet 440 including the pressure sensors 450 and 460 may be disposed between the display module 200 and the substrate 300. Also, as shown in FIG. 4b, the pressure sensors 450 and 460 may be directly formed on the bottom surface of the display panel 200A.

Also, the pressure sensing unit is formed to include, for example, a spacer layer 420 composed of an air gap. This will be described in detail with reference to FIGS. 4a to 4g.

According to the embodiment, the spacer layer 420 may be implemented by the air gap. According to the embodiment, the spacer layer 420 may be made of an impact absorbing material. According to the embodiment, the spacer layer 420 may be filled with a dielectric material. According to the embodiment, the spacer layer 420 may be made of a material having a restoring force by which the material contracts by applying the pressure and returns to its original shape by releasing the pressure. According to the embodiment, the spacer layer 420 may be made of elastic foam. Also, since the spacer layer is disposed under the display module 200, the spacer layer may be made of a transparent material or an opaque material.

Also, a reference potential layer may be disposed under the display module 200. Specifically, the reference potential layer may be formed on the substrate 300 disposed under the display module 200. Alternatively, the substrate 300 itself may serve as the reference potential layer. Also, the reference potential layer may be disposed on the cover (not shown) which is disposed on the substrate 300 and under the display module 200 and functions to protect the display module 200. Alternatively, the cover itself may serve as the reference potential layer. When a pressure is applied to the touch input device 1000, the display panel 200A is bent. Due to the bending of the display panel 200A, a distance between the reference potential layer and the pressure sensor 450 and 460 may be changed. Also, the spacer layer may be disposed between the reference potential layer and the pressure sensor 450 and 460. Specifically, the spacer layer may be disposed between the display module 200 and the substrate 300 where the reference potential layer has been disposed or between the display module 200 and the cover where the reference potential layer has been disposed.

Also, the reference potential layer may be disposed inside the display module 200. Specifically, the reference potential layer may be disposed on the top surfaces or bottom surfaces of the first substrate layers 261 and 281 of the display panel 200A or on the top surfaces or bottom surfaces of the second substrate layers 262 and 283. When a pressure is applied to the touch input device 1000, the display panel 200A is bent. Due to the bending of the display panel 200A, the distance between the reference potential layer and the pressure sensor 450 and 460 may be changed. Also, the spacer layer may be disposed between the reference potential layer and the pressure sensor 450 and 460. In the case of the touch input device 1000 shown in FIGS. 3a and 3b, the spacer layer may be disposed on or inside the display panel 200A.

Likewise, according to the embodiment, the spacer layer may be implemented by the air gap. According to the embodiment, the spacer layer may be made of an impact absorbing material. According to the embodiment, the spacer layer may be filled with a dielectric material. According to the embodiment, the spacer layer may be made of a material having a restoring force by which the material contracts by applying the pressure and returns to its original shape by releasing the pressure. According to the embodiment, the spacer layer may be made of an elastic foam. Also, since the spacer layer is disposed on or inside the display panel 200A, the spacer layer may be made of a transparent material.

According to the embodiment, when the spacer layer is disposed inside the display module 200, the spacer layer may be the air gap which is included during the manufacture of the display panel 200A and/or the backlight unit. When the display panel 200A and/or the backlight unit includes one air gap, the one air gap may function as the spacer layer. When the display panel 200A and/or the backlight unit includes a plurality of the air gaps, the plurality of air gaps may collectively function as the spacer layer.

FIG. 4c is a perspective view of the touch input device 1000 according to the embodiment shown in FIG. 4a. As shown in FIG. 4c, the sensor sheet 440 of the first example of the present invention may be disposed between the display module 200 and the substrate 300. Here, the touch input device 1000 may include the spacer layer disposed between the display module 200 and the substrate 300 of the touch input device 1000 in order to dispose the sensor sheet 440.

Hereafter, for the purpose of clearly distinguishing the electrodes 450 and 460 from the electrode included in the touch sensor 10, the sensors 450 and 460 for detecting the pressure are designated as pressure sensors 450 and 460. Here, since the pressure sensors 450 and 460 are disposed in the rear side instead of in the front side of the display panel 200A, the pressure sensor 450 and 460 may be made of an opaque material as well as a transparent material. When the display panel 200A is the LCD panel, the light from the backlight unit must transmit through the pressure sensors 450 and 460. Therefore, the pressure sensors 450 and 460 may be made of a transparent material such as ITO.

Here, a frame 330 having a predetermined height may be formed along the border of the upper portion of the substrate 300 in order to maintain the spacer layer 420 in which the pressure sensor 450 and 460 are disposed. Here, the frame 330 may be bonded to the cover layer 100 by means of an adhesive tape (not shown). While FIG. 4c shows the frame 330 is formed on the entire border (e.g., four sides of the quadrangle) of the substrate 300, the frame 330 may be formed only on at least some (e.g., three sides of the quadrangle) of the border of the substrate 300. According to the embodiment, the frame 330 may be formed on the top surface of the substrate 300 may be integrally formed with the substrate 300 on the top surface of the substrate 300. In the embodiment of the present invention, the frame 330 may be made of an inelastic material. In the embodiment of the present invention, when a pressure is applied to the display panel 200A through the cover layer 100, the display panel 200A, together with the cover layer 100, may be bent. Therefore, the magnitude of the touch pressure can be detected even though the frame 330 is not transformed by the pressure.

FIG. 4d is a cross sectional view of the touch input device including the pressure sensor according to the embodiment of the present invention. As shown in FIG. 4d, the pressure sensors 450 and 460 according to the embodiment of the present invention may be formed within the spacer layer 420 and on the bottom surface of the display panel 200A.

The pressure sensor for detecting the pressure may include the first sensor 450 and the second sensor 460. Here, any one of the first sensor 450 and the second sensor 460 may be a drive sensor, and the other may be a receiving sensor. A drive signal is applied to the drive sensor, and a sensing signal including information on electrical characteristics changing by applying the pressure may be obtained through the receiving sensor. For example, when a voltage is applied, a mutual capacitance may be generated between the first sensor 450 and the second sensor 460.

FIG. 4e is a cross sectional view when a pressure is applied to the touch input device 1000 shown in FIG. 4d. The top surface of the substrate 300 may have a ground potential for shielding the noise. When a pressure is applied to the surface of the cover layer 100 by an object 500, the cover layer 100 and the display panel 200A may be bent or pressed. As a result, a distance "d" between the ground potential surface and the pressure sensors 450 and 460 may be decreased to "d'". In this case, due to the decrease of the distance "d", the fringing capacitance is absorbed in the top surface of the substrate 300, so that the mutual capacitance between the first sensor 450 and the second sensor 460 may be reduced. Therefore, the magnitude of the touch pressure can be calculated by obtaining the reduction amount of the mutual capacitance from the sensing signal obtained through the receiving sensor.

Although it has been described in FIG. 4e that the top surface of the substrate 300 has the ground potential, that is to say, is the reference potential layer, the reference potential layer may be disposed inside the display module 200. Here, when a pressure is applied to the surface of the cover layer 100 by the object 500, the cover layer 100 and the display panel 200A may be bent or pressed. As a result, a distance between the pressure sensors 450 and 460 and the reference potential layer disposed inside the display module 200 is changed. Therefore, the magnitude of the touch pressure can be calculated by obtaining the capacitance change amount from the sensing signal obtained through the receiving sensor.

In the touch input device 1000 according to the embodiment of the present invention, the display panel 200A may be bent or pressed by the touch applying the pressure. When the display panel 200A is bent or pressed according to the embodiment, a position showing the biggest transformation may not match the touch position. However, the display panel 200A may be shown to be bent at least at the touch position. For example, when the touch position approaches close to the border, edge, etc., of the display panel 200A, the most bent or pressed position of the display panel 200A may not match the touch position, however, the display panel 200A may be shown to be bent or pressed at least at the touch position.

In the state where the first sensor 450 and the second sensor 460 are formed in the same layer, each of the first sensor 450 and the second sensor 460 shown in FIGS. 4d and 4e may be, as shown in FIG. 8a, composed of a plurality of lozenge-shaped sensors. Here, the plurality of the first sensors 450 are connected to each other in the first axial direction, and the plurality of the second sensors 460 are connected to each other in the second axial direction orthogonal to the first axial direction. The lozenge-shaped sensors of at least one of the first sensor 450 and the second sensor 460 are connected to each other through a bridge, so that the first sensor 450 and the second sensor 460 may be insulated from each other. Also, here, the first sensor 450 and the second sensor 460 shown in FIG. 6 may be composed of a sensor having a form shown in FIG. 8b.

In the foregoing, it is shown that the touch pressure is detected from the change of the mutual capacitance between the first sensor 450 and the second sensor 460. However, the pressure sensing unit may be configured to include only any one of the first sensor 450 and the second sensor 460. In this case, it is possible to detect the magnitude of the touch pressure by detecting the change of the capacitance between the one pressure sensor and a ground layer (the reference potential layer disposed inside the display module 200 or the substrate 300), that is to say, the change of the self-capacitance. Here, the drive signal is applied to the one pressure sensor, and the change of the self-capacitance between the pressure sensor and the ground layer can be detected by the pressure sensor.

For instance, in FIG. 4d, the pressure sensor may be configured to include only the first sensor 450. Here, the magnitude of the touch pressure can be detected by the change of the capacitance between the first sensor 450 and the substrate 300, which is caused by a distance change between the substrate 300 and the first sensor 450. Since the distance "d" is reduced with the increase of the touch pressure, the capacitance between the substrate 300 and the first sensor 450 may be increased with the increase of the touch pressure. Here, the pressure sensor should not necessary have a comb teeth shape or a trident shape, which is required to improve the detection accuracy of the mutual capacitance change amount. The pressure sensor may have a plate shape (e.g., quadrangular plate). Or, as shown in FIG. 8d, the plurality of the first sensors 450 may be disposed at a regular interval in the form of a grid.

FIG. 4f shows that the pressure sensors 450 and 460 are formed within the spacer layer 420 such that the pressure sensors 450 and 460 are formed on the top surface of the substrate 300 and on the bottom surface of the display module 200. Here, when the pressure sensing unit is, as shown in FIG. 4a, composed of the sensor sheet, the sensor sheet may be composed of a first sensor sheet 440-1 including the first sensor 450 and a second sensor sheet 440-2 including the second sensor 460. Here, any one of the first sensor 450 and the second sensor 460 may be formed on the substrate 300, and the other may be formed on the bottom surface of the display module 200. FIG. 4g shows that the first sensor 450 is formed on the substrate 300, and the second sensor 460 is formed on the bottom surface of the display module 200.

FIG. 4g shows that the pressure sensors 450 and 460 are formed within the spacer layer 420 and on the top surface of the substrate 300 and on the bottom surface of the display panel 200A. Here, the first sensor 450 may be formed on the bottom surface of the display panel 200A, and the second sensor 460 may be disposed on the top surface of the substrate 300 in the form of a sensor sheet in which the second sensor 460 is formed on a first insulation layer 470 and a second insulation layer 471 is formed on the second sensor 460.

When the object 500 applies a pressure to the surface of the cover layer 100, the cover layer 100 and the display panel 200A may be bent or pressed. As a result, a distance "d" between the first sensor 450 and the second sensor 460 may be reduced. In this case, the mutual capacitance between the first sensor 450 and the second sensor 460 may be increased with the reduction of the distance "d". Therefore, the magnitude of the touch pressure can be calculated by obtaining the increase amount of the mutual capacitance from the sensing signal obtained through the receiving sensor. Here, in FIG. 4g, since the first sensor 450 and the second sensor 460 are formed in different layers, the first sensor 450 and the second sensor 460 should not necessary have a comb teeth shape or a trident shape. Any one sensor of the first sensor 450 and the second sensor 460 may have a plate shape (e.g., quadrangular plate), and the other remaining plural sensors may be, as shown in FIG. 8d, disposed at a regular interval in the form of a grid.

The foregoing has described the embodiment where the pressure sensors 450 and 460 are, as shown in FIG. 4b, directly formed on the bottom surface of the display panel 200A. However, the embodiment where the sensor sheet 440 including the pressure sensors 450 and 460 is, as shown in FIG. 4a, disposed between the display module 200 and the substrate 300 can be also applied.

In this case, the top surface of the substrate 300 may have the ground potential for shielding the noise. FIG. 5 shows a cross section of the sensor sheet according to the embodiment of the present invention. Referring to (a) of FIG. 5, the cross-sectional view shows that the sensor sheet 440 including the pressure sensors 450 and 460 has been attached to the substrate 300 or the display module 200. Here, a short-circuit can be prevented from occurring between the pressure electrodes 450 and 460 and either the substrate 300 or the display module 200 because the pressure sensors 450 and 460 are disposed between the first insulation layer 470 and the second insulation layer 471 in the sensor sheet 440. Depending on the type and/or implementation method of the touch input device 1000, the substrate 300 or the display module 200 to which the pressure sensors 450 and 460 are attached may not have the ground potential or may have a weak ground potential. In this case, the touch input device 1000 according to the embodiment of the present invention may further include a ground electrode (not shown) between the insulation layer 470 and either the substrate 300 or the display module 200. According to the embodiment of the present invention, the touch input device 1000 invention may further include another insulation layer (not shown) between the ground electrode and either the substrate 300 or the display module 200. Here, the ground electrode (not shown) is able to prevent the size of the capacitance generated between the first sensor 450 and the second sensor 460, which are pressure sensors, from increasing excessively.

It is possible to consider that the first sensor 450 and the second sensor 460 are formed in different layers in accordance with the embodiment of the present invention so that a sensor layer is formed. In (b) of FIG. 5, the cross-sectional view shows that the first sensor 450 and the second sensor 460 are formed in different layers. As shown in (b) of FIG. 5, the first sensor 450 may be formed on the first insulation layer 470, and the second sensor 460 may be formed on the second insulation layer 471 located on the first sensor 450. According to the embodiment of the present invention, the second sensor 460 may be covered with a third insulation layer 472. In other words, the sensor sheet 440 may include the first to third insulation layers 470 to 472, the first sensor 450, and the second sensor 460. Here, the first sensor 450 and the second sensor 460 may be implemented so as to overlap each other because they are disposed in different layers. For example, the first sensor 450 and the second sensor 460 may be, as shown in FIG. 8c, formed similarly to the pattern of the drive electrode TX and receiving electrode RX which are arranged in the form of M×N array. Here, M and N may be natural numbers greater than 1. Also, as shown in FIG. 8a, the lozenge-shaped first sensor 450 and the lozenge-shaped second sensor 460 may be located in different layers respectively.

In (c) of FIG. 5, the cross-sectional view shows that the sensor sheet 440 is implemented to include only the first sensor 450. As shown in (c) of FIG. 5, the sensor sheet 440 including the first sensor 450 may be disposed on the substrate 300 or the display module 200.

In (d) of FIG. 5, the cross-sectional view shows that the first sensor sheet 440-1 including the first sensor 450 is attached to the substrate 300, and the second sensor sheet 440-2 including the second sensor 460 is attached to the display module 200. As shown in (d) of FIG. 5, the first sensor sheet 440-1 including the first sensor 450 may be disposed on the substrate 300. Also, the second sensor sheet 440-2 including the second sensor 460 may be disposed on the bottom surface of the display module 200.

As with the description related to (a) of FIG. 5, when the substrate 300 or the display module 200 to which the pressure sensors 450 and 460 are attached may not have the ground potential or may have a weak ground potential, the sensor sheet 440 in (a) to (d) of FIG. 5 may further include a ground electrode (not shown) between the first insulation layers 470, 470-1, and 470-2 and either the substrate 300 or the display module 200. Here, the sensor sheet 440 may further include an additional insulation layer (not shown) between the ground electrode (not shown) and either the substrate 300 or the display module 200.

In the touch input device 1000 according to the embodiment of the present invention, the pressure sensors 450 and 460 may be directly formed on the display panel 200A. FIGS. 6a to 6c are cross sectional views showing an embodiment of the pressure sensor formed directly on various display panel of the touch input device according to the embodiment of the present invention.

First, FIG. 6a shows the pressure sensors 450 and 460 formed on the display panel 200A using the LCD panel. Specifically, as shown in FIG. 6a, the pressure sensors 450 and 460 may be formed on the bottom surface of the second substrate layer 262. Here, the pressure sensors 450 and 460 may be formed on the bottom surface of the second polarization layer 272. In detecting the touch pressure on the basis of the mutual capacitance change amount when a pressure is applied to the touch input device 1000, a drive signal is applied to the drive sensor 450, and an electrical signal including information on the capacitance which is changed by the distance change between the pressure sensors 450 and 460 and the reference potential layer separated from the pressure sensors 450 and 460 is received from the receiving sensor 460. When the touch pressure is detected on the basis of the self-capacitance change amount, a drive signal is applied to the pressure sensors 450 and 460, and an electrical signal including information on the capacitance which is changed by the distance change between the pressure sensors 450 and 460 and the reference potential layer separated from the pressure sensors 450 and 460 is received from the pressure sensors 450 and 460. Here, the reference potential layer may be the substrate 300 or may be the cover which is disposed between the display panel 200A and the substrate 300 and performs a function of protecting the display panel 200A.

Next, FIG. 6b shows the pressure sensors 450 and 460 formed on the bottom surface of the display panel 200A using the OLED panel (in particular, AM-OLED panel). Specifically, the pressure sensors 450 and 460 may be formed on the bottom surface of the second substrate layer 283. Here, a method for detecting the pressure is the same as that described in FIG. 6a.

In the case of the OLED panel, since the organic material layer 280 emits light, the pressure sensors 450 and 460 which are formed on the bottom surface of the second substrate layer 283 disposed under the organic material layer 280 may be made of an opaque material. However, in this case, a pattern of the pressure sensors 450 and 460 formed on the bottom surface of the display panel 200A may be shown to the user. Therefore, for the purpose of directly forming the pressure sensors 450 and 460 on the bottom surface of the second substrate layer 283, a light shielding layer like black ink is applied on the bottom surface of the second substrate layer 283, and then the pressure sensors 450 and 460 may be formed on the light shielding layer.

Also, FIG. 6b shows that the pressure sensors 450 and 460 are formed on the bottom surface of the second substrate layer 283. However, a third substrate layer (not shown) may be disposed under the second substrate layer 283, and the pressure sensors 450 and 460 may be formed on the bottom surface of the third substrate layer. In particular, when the display panel 200A is a flexible OLED panel, the third substrate layer which is not relatively easily bent may be disposed under the second substrate layer 283 because the display panel 200A composed of the first substrate layer 281, the organic material layer 280, and the second substrate layer 283 is very thin and easily bent.

Next, FIG. 6c shows the pressure sensors 450 and 460 formed inside the display panel 200A using the OLED panel. Specifically, the pressure sensors 450 and 460 may be formed on the top surface of the second substrate layer 283. Here, a method for detecting the pressure is the same as that described in FIG. 6a.

Also, although the display panel 200A using the OLED panel has been described by taking an example thereof with reference to FIG. 6c, it is possible that the pressure sensors 450 and 460 are formed on the top surface of the second substrate layer 262 of the display panel 200A using the LCD panel.

Also, although it has been described in FIGS. 6a to 6c that the pressure sensors 450 and 460 are formed on the top surfaces or bottom surfaces of the second substrate layers 262 and 283, it is possible that the pressure sensors 450 and 460 are formed on the top surfaces or bottom surfaces of the first substrate layers 261 and 281.

Also, it has been described in FIGS. 6a to 6c that the pressure sensing unit including the pressure sensors 450 and 460 is directly formed on the display panel 200A. However, the pressure sensing unit may be directly formed on the substrate 300, and the potential layer may be the display panel 200A or may be the cover which is disposed between the display panel 200A and the substrate 300 and performs a function of protecting the display panel 200A.

Also, although it has been described in FIGS. 6a to 6c that the reference potential layer is disposed under the pressure sensing unit, the reference potential layer may be disposed within the display panel 200A. Specifically, the reference potential layer may be disposed on the top surface or bottom surface of the first substrate layers 261 and 281 of the display panel 200A or may be disposed on the top surface or bottom surface of the second substrate layers 262 and 283.

In the touch input device 1000 according to the embodiment of the present invention, the pressure sensors 450 and 460 for sensing the capacitance change amount may be, as described in FIG. 4g, composed of the first sensor 450 which is directly formed on the display panel 200A and the second sensor 460 which is configured in the form of a sensor sheet. Specifically, the first sensor 450 may be, as described in FIGS. 6a to 6c, directly formed on the display panel 200A, and second sensor 460 may be, as described in FIG. 4g, configured in the form of a sensor sheet and may be attached to the touch input device 1000.

FIG. 7a is a view of a portion of the touch input device according to the embodiment of the present invention as viewed in an opposite direction of the touch surface. FIG. 7a shows that the pressure sensing unit is disposed on the bottom surface 201 of the display module 200. Here, in the touch input device 1000 to which the pressure sensing unit according to the embodiment of the present invention is applied, when the pressure sensor controller 1300 and the touch sensor controller 1100 are integrated into one IC and driven, a controller of the IC may perform the scanning of the touch sensor 10 and simultaneously perform the scanning of the pressure sensing unit, or the controller of the IC may perform the time-sharing, and then may generate a control signal such that the scanning of the touch sensor 10 is performed in a first time interval and the scanning of the pressure sensing unit is performed in a second time interval different from the first time interval.

Therefore, in the embodiment of the present invention, the pressure sensors 450 and 460 included in the pressure sensing unit must be electrically connected to the drive unit and/or sensing unit of the pressure sensor controller 1300. In general, as shown in FIG. 7a, a trace 451 extending from the pressure sensor 450 may be connected through a first connection portion 600 to an end of a first connection line pattern 161 formed in a first PCB 160, and the pressure sensor controller 1300 may be electrically connected to the other end of the first connection line pattern 161. Here, the first PCB 160 may be the touch PCB or the display PCB.

Here, since the pressure sensing unit shown in FIG. 7a is composed of nine pressure sensors 450, the nine traces 451 extending from the respective pressure sensors 450 are provided. Therefore, the area of the first connection portion 600 should become larger such that the nine traces 451 are insulated from each other and connected to the first connection line pattern 161, and the connection structure may become more complicated. Likewise, the area of the first connection line pattern 161 should be also larger corresponding to respective nine channels and the number of pins that should be assigned to the pressure sensor controller 1300 is also increased. Moreover, though not shown in FIG. 7a, when the pressure sensing unit further includes a reference sensor for compensating for the effect caused by a temperature or display noise, etc., and/or an ESD protective electrode for reducing the effect of ESD, the number of the channels increases. As a result, the first connection portion 600 may have a larger area and may become more complicated, the first connection line pattern 161 may have a larger area, and the number of the pins assigned to the pressure sensor controller 1300 may be increased.

FIGS. 7b and 7c are views of a portion of the touch input device in which a pressure sensing unit according to the embodiment of the present invention has been disposed, as viewed in the opposite direction of the touch surface. FIGS. 7d to 7j are plan views of the pressure sensing unit according to the embodiment of the present invention.

In order to reduce the number of the channels, the pressure sensing unit according to the embodiment of the present invention may include one pressure sensor instead of the plurality of pressure sensors. However, in this case, the sensitivity may be reduced depending on the position where the pressure is applied because the pressure is detected from the capacitance received in one channel irrespective of the position where the pressure is applied. Specifically, the change of the capacitance detected by the pressure sensing unit includes the capacitance change due to the applying the pressure and the capacitance change due to the temperature and other noises such as display noise, etc. The capacitance is proportional to the area of the sensor. Therefore, when the pressure sensing unit constitutes one channel, the same total capacitance change amount is detected regardless of whether the capacitance change amount due to the actual pressure application among the total capacitance change amount is relatively great or small. Therefore, the sensitivity may be reduced depending on the position where the pressure is applied. More specifically, when the same pressure is applied, while the cover layer 100 and the display panel 200A are much bent in the central region of the touch input device 1000, the cover layer 100 and the display panel 200A are relatively less bent in the edge region of the touch input device 1000. Thus, while the capacitance change due to the actual pressure application occupies a big part of the capacitance change detected when the pressure is applied to the central region of the touch input device 1000, the capacitance change due to the actual pressure application occupies a relatively small part of the capacitance change detected when the pressure is applied to the edge region of the touch input device 1000. Accordingly, an SNR in the edge region of the touch input device 1000 may be reduced. Therefore, the region of the touch input device 1000 is divided into the region in which the cover layer 100 and the display panel 200A are relatively much bent and the region in which the cover layer 100 and the display panel 200A are relatively less bent, and it is preferable that the SNR in the region in which relatively less bent is improved.

As shown in FIG. 7b, a central pressure sensor 550 having a relatively large area may be disposed corresponding to the central region of the touch input device 1000, that is to say, to the region in which the cover layer 100 and the display panel 200A are relatively much bent in the touch input device 1000. Also, a non-central pressure sensor 551 having a relatively small area may be disposed corresponding to the edge region of the touch input device 1000, that is to say, to the region in which the cover layer 100 and the display panel 200A are relatively less bent in the touch input device 1000. In other words, the pressure sensing unit according to the embodiment of the present invention may include the one central pressure sensor 550 and a plurality of the non-central pressure sensors 551. Here, the area of each non-central pressure sensor 551 may be less than that of the central pressure sensor 550.

As shown in FIG. 7c, the central pressure sensor 550 consisting of the plurality of the pressure sensors connected to each other may be disposed in the central region of the touch input device 1000, that is to say, to the region in which the cover layer 100 and the display panel 200A are relatively much bent in the touch input device 1000. Also, the non-central pressure sensor 551 having a relatively small area may be disposed corresponding to the edge region of the touch input device 1000, that is to say, to the region in which the cover layer 100 and the display panel 200A are relatively less bent in the touch input device 1000. In other words, the pressure sensing unit according to the embodiment of the present invention may include the central pressure sensor 550 consisting of the plurality of the pressure sensors connected to each other, and the plurality of the non-central pressure sensors 551. Here, the area of each non-central pressure sensor 551 may be less than the summation of the areas of the plurality of the pressure sensors constituting the central pressure sensor 550.

Here, the plurality of the pressure sensors constituting the central pressure sensor 550 may not be connected within the pressure sensing unit and be connected within the pressure sensor controller 1300 by software. That is, the pressure sensor controller 1300 may receive a signal including information on the electrical characteristics from each of the plurality of the pressure sensors constituting the central pressure sensor 550 and may calculate a pressure value sensed by the one central pressure sensor 550 on the basis of values corresponding to the magnitudes of the pressure calculated from the respective signals. In this case, although the area and complexity of the first connection portion 600, the area of the first connection line pattern 161, and the number of the pins assigned to the pressure sensor controller 1300 are not reduced, the SNR in the edge region compared to the central region can be improved.

Also, four non-central pressure sensors 551 may be provided and may be disposed respectively in the four corner regions of the pressure sensing unit which correspond to the region in which the cover layer 100 and the display panel 200A are the least bent in the region where the pressure sensing unit is disposed. Specifically, the pressure sensing unit may, as shown in FIG. 7b, consist of the cross-shaped central pressure sensor 550 and four quadrangular non-central pressure sensors 551, or may, as shown in FIG. 7d, consist of the diamond-shaped central pressure sensor 550 and four triangular non-central pressure sensors 551 or may, as shown in FIG. 7e, consist of the elliptical central pressure sensor 550 and four non-central pressure sensors 551 having a triangle shape with a concave hypotenuse. As such, the SNR in the edge region can be improved by reducing the area of the sensor, which corresponds to the edge region in which the cover layer 100 and the display panel 200A are relatively less bent.

As such, when the pressure sensing unit consists of the one central pressure sensor 550 and four non-central pressure sensor 551, the pressure sensing unit can constitute only five channels by reducing the number of the channels of the pressure sensing unit shown in FIG. 7a while keeping the sensitivity from being significantly reduced compared to the pressure sensing unit shown in FIG. 7a.

FIG. 7f is a plan view of another pressure sensing unit according to the embodiment of the present invention. The pressure sensing unit according to the embodiment of the present invention may further include, as shown in FIG. 7f, the reference sensor 552 for compensating for the effect caused by a temperature or display noise, etc. Here, it is preferable that the capacitance detected by the reference sensor 552 should be changed very little by the pressure application and be mainly changed only by a temperature or display noise, etc. Therefore, the reference sensor 552 may be placed in a position where the cover layer and the display panel are not bent or are very slightly bent even though the pressure is applied. Specifically, the reference sensor 552 may be disposed on the outskirt of the non-central pressure sensor 551. In this case, as shown in FIG. 7f, the pressure sensing unit may constitute only a total of six channels.

FIG. 7g is a plan view of further another pressure sensing unit according to the embodiment of the present invention. The pressure sensing unit according to the embodiment of the present invention may further include, as shown in FIG. 7g, an ESD protective electrode 553 for reducing the effect of ESD. The ESD protective electrode 553 may be disposed outside the central pressure sensor 550 and the non-central pressure sensor 551 and surround them. The ESD protective electrode 553 may be disposed in the edge region of the touch input device 1000 when the pressure sensing unit is disposed in the touch input device 1000. Specifically, the ESD protective electrode 553 may be disposed in the edge region of the display module 200. The ESD protective electrode 553 is disposed in the form of surrounding the central pressure sensor 550 and the non-central pressure sensor 551, so that the ESD protective electrode 553 maximally absorbs the ESD transmitted from the outsides of the central pressure sensor 550 and the non-central pressure sensor 551 to the central pressure sensor 550 and the non-central pressure sensor 551, and thus circuit damage through the central pressure sensor 550 and the non-central pressure sensor 551 can be reduced. The trace extending from the ESD protective electrode 553 is also connected to the ground electrode of the first PCB 160 through the first connection portion 600, so that the ESD absorbed by the ESD protective electrode 553 can be discharged through the ground electrode. In this case, the pressure sensing unit may constitute one central pressure sensor 550, four non-central pressure sensors 551, and one ESD protective electrode 553, that is to say, may constitute only a total of six channels. Also, when the reference sensor 552 is, as shown in FIG. 7g, included in the pressure sensing unit, the pressure sensing unit may constitute only a total of seven channels.

FIG. 7h is a plan view of yet another pressure sensing unit according to the embodiment of the present invention. In the pressure sensing unit according to the embodiment of the present invention may further include, as shown in FIG. 7h, four non-central pressure sensors 551 are connected to each other to form one channel. In this case, although the SNR in the edge region may be slightly reduced compared to the pressure sensing unit shown in FIG. 7b, the pressure sensing unit can constitute only two channels, so that the area and complexity of the first connection portion 600, the area of the first connection line pattern 161, and the number of the pins assigned to the pressure sensor controller 1300 can be significantly reduced. Although it has been described in FIG. 7h that four non-central pressure sensors 551 are provided, there is no limitation to this. It is possible to form one channel by connecting any number of the non-central pressure sensors 551 of the plurality of the non-central pressure sensors 551 to each other. Therefore, the plurality of the non-central pressure sensors 551 are divided into a plurality of sensor sets, and the sensors included in the sensor set are connected to each other, so that the channels of which the number is the same as that of the sensor sets can be formed. That is, the plurality of the non-central pressure sensors 551 constitute the N number of sensor sets, so that the N number of channels can be formed and the pressure sensing unit can constitute a total of the N+1 number of channels. For example, in the pressure sensing unit shown in FIG. 7h, two sensor sets are formed by grouping two non-central pressure sensors each, so that two channels can be formed from the four non-central pressure sensors 551, and one channel can be formed from the central pressure sensor 550. As a result, the pressure sensing unit can constitute a total of three channels.

FIG. 7i is a view of a portion of the touch input device in which another pressure sensing unit according to the embodiment of the present invention has been disposed, as viewed in the opposite direction of the touch surface. Although it has been described in FIGS. 7b to 7h that the pressure sensing unit is, as shown in FIG. 4a, disposed in the touch input device 1000 in the form of the sensor sheet 440, there is no limitation to this. As shown in FIGS. 4b and 6a to 6c, this can be applied to a case where the sensor included in the pressure sensing unit is directly formed on the display panel 200A. Specifically, as shown in FIG. 7i, the central pressure sensor 550 and the non-central pressure sensor 551 may be directly formed on the bottom surface 201 of the display panel 200A. As such, when the pressure sensing unit is directly formed on the display panel 200A, the pressure sensing unit becomes closer to the display panel 200A, so that the display noise effect may become greater than that of the pressure sensing unit in the form of the sensor sheet 440. Therefore, it is more effective to separately form the non-central pressure sensor 551 having a relatively smaller area than that of the central pressure sensor 550. Also, when the pressure sensing unit is directly formed on the display panel 200A, the trace extending from the central pressure sensor 550 and the non-central pressure sensor 551 is, as shown in FIG. 7i, also directly formed on the display panel 200A. Therefore, in order to connect the trace to the first PCB 160, an anisotropic conductive film, conductive ink such as silver paste, or a conductive tape can be used while a typical connected cannot be used. When the anisotropic conductive film is used, high temperature and high pressure bonding is required. Therefore, the anisotropic conductive film cannot be applied to the position corresponding to the display area and can be applied only to the edge region of the touch input device. Also, when the conductive ink or conductive tape is used, it is difficult to connect a large number of the channels because a bonding area per channel is large. Also, as shown in FIG. 7i, the trace can be connected to the first PCB 160 through an additional FPCB 360 and an additional connection line pattern 361 formed on the additional FPCB 360. Therefore, as shown in FIGS. 7b to 7h, the number of the channels is more effectively reduced.

FIG. 7j is a plan view of still another pressure sensing unit according to the embodiment of the present invention. The foregoing has described that the pressure sensor 450 included in the pressure sensing unit is composed of the electrodes and, as the electrical characteristic sensed by the pressure sensing unit, the capacitance change amount due to the bending of the display panel 200A is detected, so that the magnitude of the pressure is detected. However, there is no limitation to this. The pressure sensor 450 included in the pressure sensing unit is, as shown in FIG. 7j, is composed of a strain gauge and, as the electrical characteristic sensed by the pressure sensing unit, the change amount of the resistance value of the pressure sensor 450, which is changed due to the bending of the display panel 200A, is detected, so that the magnitude of the pressure can be also detected. Even in this case, the method described in FIGS. 7b to 7i can be applied in the same manner.

Although embodiments of the present invention were described above, these are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

What is claimed is:

1. A touch input device capable of detecting a touch pressure, the touch input device comprising:
   a display panel; and
   a pressure sensing unit which is disposed under the display panel;
   wherein the pressure sensing unit comprises one central pressure sensor for detecting the touch pressure and a plurality of non-central pressure sensors for detecting the touch pressure;
   wherein an area of each of the non-central pressure sensors is less than that of the central pressure sensor; and
   wherein the plurality of non-central pressure sensors are disposed in an edge region of the touch input device for improving a signal-to-noise ratio of the edge region of the touch input device when detecting the touch pressure.

2. The touch input device of claim 1,
   wherein the four non-central pressure sensors are provided; and
   wherein the four non-central pressure sensors are disposed in four corner regions of the pressure sensing unit respectively.

3. The touch input device of claim 2, wherein the pressure sensing unit constitutes five channels which correspond to the central pressure sensor and the respective non-central pressure sensors, respectively.

4. The touch input device of claim 2,
   wherein the pressure sensing unit further comprises a reference sensor for compensating for an effect caused by a temperature or display noise; and
   wherein the pressure sensing unit constitutes six channels which correspond to the central pressure sensor, the respective non-central pressure sensors, and the reference sensor, respectively.

5. The touch input device of claim 2,
   wherein the pressure sensing unit further comprises a reference sensor for compensating for an effect caused by a temperature or display noise and further comprises an ESD protective electrode for reducing an effect of ESD; and
   wherein the pressure sensing unit constitutes seven channels which correspond to the central pressure sensor, the respective non-central pressure sensors, the reference sensor, and the ESD protective electrode, respectively.

6. The touch input device of claim 1,
   wherein the plurality of the non-central pressure sensors are connected to each other; and
   wherein the pressure sensing unit constitutes two channels which correspond to the central pressure sensor and connected the non-central pressure sensors.

7. The touch input device of claim 1,
   wherein the pressure sensing unit further comprises a reference sensor for compensating for an effect caused by a temperature or display noise;
   wherein the plurality of the non-central pressure sensors are connected to each other; and
   wherein the pressure sensing unit constitutes three channels which correspond to the central pressure sensor, the connected non-central pressure sensors, and the reference sensor, respectively.

8. The touch input device of claim 1,
   wherein the pressure sensing unit further comprises a reference sensor for compensating for an effect caused by a temperature or display noise and further comprises an ESD protective electrode for reducing an effect of ESD;
   wherein the plurality of the non-central pressure sensors are connected to each other; and
   wherein the pressure sensing unit constitutes four channels which correspond to the central pressure sensor, the plurality of the non-central pressure sensors, the reference sensor, and the ESD protective electrode, respectively.

9. The touch input device of claim 1,
   wherein the plurality of the non-central pressure sensors are composed of N number of electrode sets;
   wherein the non-central pressure sensors comprised in the respective electrode sets are connected to each other; and wherein the pressure sensing unit constitutes N+1 number of channels which correspond to the central pressure sensor and the N number of the electrode sets, respectively.

10. The touch input device of claim 1,
wherein the pressure sensing unit further comprises a reference sensor for compensating for an effect caused by a temperature or display noise;
wherein the plurality of the non-central pressure sensors are composed of N number of electrode sets;
wherein the non-central pressure sensors comprised in the respective electrode sets are connected to each other; and
wherein the pressure sensing unit constitutes N+2 number of channels which correspond to the central pressure sensor, the N number of the electrode sets, and the reference sensor, respectively.

11. The touch input device of claim 1,
wherein the pressure sensing unit further comprises a reference sensor for compensating for an effect caused by a temperature or display noise and further comprises an ESD protective electrode for reducing an effect of ESD;
wherein the plurality of the non-central pressure sensors are composed of N number of electrode sets;
wherein the non-central pressure sensors comprised in the respective electrode sets are connected to each other; and
wherein the pressure sensing unit constitutes N+3 number of channels which correspond to the central pressure sensor, the N number of the electrode sets, the reference sensor, and the ESD protective electrode, respectively.

12. A touch input device capable of detecting a touch pressure, the touch input device comprising:
a display panel; and
a pressure sensing unit which is disposed under the display panel;
wherein the pressure sensing unit comprises one central pressure sensor for detecting the touch pressure, which is composed of a plurality of pressure sensors connected to each other, and a plurality of non-central pressure sensors for detecting the touch pressure;
wherein an area of each of the non-central pressure sensors is less than a summation of the plurality of the pressure sensors; and
wherein the plurality of non-central pressure sensors are disposed in an edge region of the touch input device for improving a signal-to-noise ratio of the edge region of the touch input device when detecting the touch pressure.

13. The touch input device of claim 12,
wherein the four non-central pressure sensors are provided; and
wherein the four non-central pressure sensors are disposed in four corner regions of the pressure sensing unit respectively.

14. The touch input device of claim 13, wherein the pressure sensing unit constitutes five channels which correspond to the central pressure sensor and the respective non-central pressure sensors, respectively.

15. The touch input device of claim 13,
wherein the pressure sensing unit further comprises a reference sensor for compensating for an effect caused by a temperature or display noise; and
wherein the pressure sensing unit constitutes six channels which correspond to the central pressure sensor, the respective non-central pressure sensors, and the reference sensor, respectively.

16. The touch input device of claim 13,
wherein the pressure sensing unit further comprises a reference sensor for compensating for an effect caused by a temperature or display noise and further comprises an ESD protective electrode for reducing an effect of ESD; and
wherein the pressure sensing unit constitutes seven channels which correspond to the central pressure sensor, the respective non-central pressure sensors, the reference sensor, and the ESD protective electrode, respectively.

17. The touch input device of claim 12,
wherein the plurality of the non-central pressure sensors are connected to each other; and
wherein the pressure sensing unit constitutes two channels which correspond to the central pressure sensor and connected the non-central pressure sensors.

18. The touch input device of claim 12,
wherein the pressure sensing unit further comprises a reference sensor for compensating for an effect caused by a temperature or display noise;
wherein the plurality of the non-central pressure sensors are connected to each other; and
wherein the pressure sensing unit constitutes three channels which correspond to the central pressure sensor, the connected non-central pressure sensors, and the reference sensor, respectively.

19. The touch input device of claim 12,
wherein the pressure sensing unit further comprises a reference sensor for compensating for an effect caused by a temperature or display noise and further comprises an ESD protective electrode for reducing an effect of ESD;
wherein the plurality of the non-central pressure sensors are connected to each other; and
wherein the pressure sensing unit constitutes four channels which correspond to the central pressure sensor, the plurality of the non-central pressure sensors, the reference sensor, and the ESD protective electrode, respectively.

20. The touch input device of claim 12,
wherein the plurality of the non-central pressure sensors are composed of N number of electrode sets;
wherein the non-central pressure sensors comprised in the respective electrode sets are connected to each other; and
wherein the pressure sensing unit constitutes N+1 number of channels which correspond to the central pressure sensor and the N number of the electrode sets, respectively.

21. The touch input device of claim 12,
wherein the pressure sensing unit further comprises a reference sensor for compensating for an effect caused by a temperature or display noise;
wherein the plurality of the non-central pressure sensors are composed of N number of electrode sets;
wherein the non-central pressure sensors comprised in the respective electrode sets are connected to each other; and
wherein the pressure sensing unit constitutes N+2 number of channels which correspond to the central pressure sensor, the N number of the electrode sets, and the reference sensor, respectively.

22. The touch input device of claim 12,
wherein the pressure sensing unit further comprises a reference sensor for compensating for an effect caused by a temperature or display noise and further comprises an ESD protective electrode for reducing an effect of ESD;
wherein the plurality of the non-central pressure sensors are composed of N number of electrode sets;
wherein the non-central pressure sensors comprised in the respective electrode sets are connected to each other; and
wherein the pressure sensing unit constitutes N+3 number of channels which correspond to the central pressure sensor, the N number of the electrode sets, the reference sensor, and the ESD protective electrode, respectively.

23. The touch input device of claim 1 wherein the non-central pressure sensors surround a center point of the central pressure sensor.

24. The touch input device of claim 23 wherein a longitudinal axis intersects the center point of the central pressure sensor, and the non-central pressure sensors are located on opposing sides of the longitudinal axis.

* * * * *